(12) United States Patent
Bernstein

(10) Patent No.: US 7,944,124 B1
(45) Date of Patent: May 17, 2011

(54) MEMS STRUCTURE HAVING A STRESS-INDUCER TEMPERATURE-COMPENSATED RESONATOR MEMBER

(75) Inventor: David H. Bernstein, San Francisco, CA (US)

(73) Assignee: Silicon Laboratories Inc., Austin, TX (US)

( * ) Notice: Subject to any disclaimer, the term of this patent is extended or adjusted under 35 U.S.C. 154(b) by 350 days.

(21) Appl. No.: 12/201,819

(22) Filed: Aug. 29, 2008

(51) Int. Cl.
*H01L 23/34* (2006.01)

(52) U.S. Cl. ........ 310/346; 310/328; 310/367; 310/370; 310/361

(58) Field of Classification Search .................. 310/370, 310/346, 351, 328, 367
See application file for complete search history.

(56) References Cited

U.S. PATENT DOCUMENTS

| | | | | |
|---|---|---|---|---|
| 5,541,469 | A * | 7/1996 | Kaida | 310/367 |
| 5,912,528 | A * | 6/1999 | Kumada | 310/353 |
| 6,557,419 | B1 | 5/2003 | Herb et al. | |
| 6,686,807 | B1 | 2/2004 | Giousouf et al. | |
| 6,708,491 | B1 | 3/2004 | Weaver et al. | |
| 6,717,336 | B2 * | 4/2004 | Kawashima | 310/367 |
| 6,739,190 | B2 * | 5/2004 | Hsu et al. | 73/497 |
| 6,987,432 | B2 * | 1/2006 | Lutz et al. | 333/186 |
| 6,996,884 | B2 * | 2/2006 | Aratake et al. | 29/25.35 |
| 7,023,065 | B2 | 4/2006 | Ayazi et al. | |
| 7,071,793 | B2 | 7/2006 | Lutz et al. | |
| 7,202,761 | B2 | 4/2007 | Lutz et al. | |
| 7,211,926 | B2 | 5/2007 | Quevy et al. | |
| 7,300,814 | B2 | 11/2007 | Cunningham et al. | |
| 7,350,424 | B2 | 4/2008 | Hjelt et al. | |
| 7,495,199 | B2 | 2/2009 | Jankowiak | |
| 7,514,853 | B1 | 4/2009 | Howe et al. | |
| 7,591,201 | B1 | 9/2009 | Bernstein et al. | |
| 7,639,104 | B1 | 12/2009 | Quevy et al. | |
| 2002/0154380 | A1 * | 10/2002 | Gelbart | 359/290 |
| 2003/0006679 | A1 * | 1/2003 | Kawashima | 310/351 |
| 2005/0046504 | A1 * | 3/2005 | Xiaoyu et al. | 331/154 |
| 2005/0250236 | A1 | 11/2005 | Takeuchi et al. | |
| 2006/0032306 | A1 * | 2/2006 | Robert | 73/504.02 |
| 2006/0033594 | A1 | 2/2006 | Lutz et al. | |
| 2006/0186971 | A1 | 8/2006 | Lutz et al. | |
| 2008/0105951 | A1 | 5/2008 | Sato et al. | |
| 2008/0224241 | A1 | 9/2008 | Inaba et al. | |
| 2009/0158566 | A1 | 6/2009 | Hagelin et al. | |
| 2009/0160581 | A1 | 6/2009 | Hagelin et al. | |
| 2010/0093125 | A1 | 4/2010 | Quevy et al. | |

OTHER PUBLICATIONS

Office Action from U.S. Appl. No. 11/801,774 mailed Apr. 30, 2008, 14 pgs.
Office Action from U.S. Appl. No. 11/716,115, mailed Oct. 6, 2008, 19 pgs.
Office Action from U.S. Appl. No. 11/716,285 mailed Feb. 27, 2009, 16 pgs.
Guckel, H., et al., "Diagnostic Microstructures for the Measurement of Intrinsic Strain in Thin Films," *J. Micromech. Microeng.* 2, 1997, United Kingdom, 86-95.

(Continued)

*Primary Examiner* — Walter Benson
*Assistant Examiner* — Bryan P Gordon
(74) *Attorney, Agent, or Firm* — O'Keefe, Egan, Peterman & Ender LLP

(57) ABSTRACT

A MEMS structure having a stress-inducer temperature-compensated resonator member is described. The MEMS structure includes a frame disposed above a substrate. The frame has an inner surface and an outer surface and is composed of a first material having a first coefficient of thermal expansion (CTE) and a second material having a second CTE, different from the first CTE. A resonator member is coupled to the inner surface of the frame.

37 Claims, 14 Drawing Sheets

OTHER PUBLICATIONS

Jianqiang, Han, et al., "Dependence of the resonance frequency of thermally excited microcantilever resonators on temperature," *Elsevier, Sensors and Actuators*, A101, (2002), 37-41.

Omura, Yoshiteru, et al., "New Resonant Accelerometer Based on Rigidity Change," *International Conference on Solid-State Sensors and Actuators*, Jun. 16-19, 1997, 855-858.

Quevy, Emmanuel P., et al., "Redundant MEMS Resonators for Precise Reference Oscillators," *IEEE Radio Frequency Integrated Circuits Symposium*, Jun. 12-14, 2005, Long Beach, CA, 113-116.

Shen, F., et al., "Thermal Effects on Coated Resonant Microcantilevers," *Elsevier, Sensors and Actuators*, A95, (2001), 17-23.

Bernstein et al., "MEMS Structure Having a Compensated Resonating Member", U.S. Appl. No. 11/716,285, (P0004), Amendment, May 27, 2009, 17 pgs.

Bernstein et al., "MEMS Structure Having a Compensated Resonating Member", U.S. Appl. No. 11/716,285, (P0004), Notice of Allowance, Jun. 22, 2009, 4 pgs.

Quevy et al., "Method for Temperature Compensation in MEMS Resonators With Isolated Regions of Distinct Materials", U.S. Appl. No. 11/716,115, (P0003), Response to Office Action, Jan. 6, 2009, 20 pgs.

Quevy et al., "Method for Temperature Compensation in MEMS Resonators With Isolated Regions of Distinct Materials", U.S. Appl. No. 11/716,115, (P0003), Notice of Allowance, Apr. 7, 2009, 6 pgs.

Quevy et al., "Method for Temperature Compensation in MEMS Resonators With Isolated Regions of Distinct Materials", U.S. Appl. No. 11/716,115, (P0003), Request for Continued Examination, Jul. 1, 2009, 1 pg.

Quevy et al., "Method for Temperature Compensation in MEMS Resonators With Isolated Regions of Distinct Materials", U.S. Appl. No. 11/716,115, (P0003), Notice of Allowance, Aug. 10, 2009, 7 pgs.

Howe et al., "MEMS Structure Having a Stress Inverter Temperature Compensated Resonanting Member", U.S. Appl. No. 11/801,774, (P0010), Amendment, Jul. 30, 2008, 16 pgs.

Howe et al., "MEMS Structure Having a Stress Inverter Temperature Compensated Resonanting Member", U.S. Appl. No. 11/801,774, (P0010), Notice of Allowance, Nov. 26, 2008, 8 pgs.

Quevy et al., "Method for Temperature Compensation in MEMS Resonators With Isolated Regions of Distinct Material", U.S. Appl. No. 12/950,519, filed Nov. 19, 2010, 46 pgs.

Motiee et al., "MEMS Structure Having a Stress Inverter Temperature Compensated Resonator Member", U.S. Appl. No. 12/204,713, filed Sep. 4, 2008, 56 pgs.

Motiee et al., "MEMS Structure Having a Stress Inverter Temperature Compensated Resonator Member", U.S. Appl. No. 12/204,713, Office Action, Nov. 15, 2010, 12 pgs.

Motiee et al., "MEMS Structure Having a Stress Inverter Temperature Compensated Resonator Member", U.S. Appl. No. 12/204,713, Amendment and Response to Office Action, Filed Feb. 11, 2011, 11 pgs.

\* cited by examiner

MEMS STRUCTURE HAVING A STRESS-INDUCER TEMPERATURE-COMPENSATED RESONATOR MEMBER

BACKGROUND

1) Field

Embodiments of the invention are in the field of Microelectromechanical Systems (MEMS) and, in particular, temperature compensation of a MEMS resonator.

2) Description of Related Art

For the past several years, MEMS structures have been playing an increasingly important role in consumer products. For example, MEMS devices, such as sensors, detectors and mirrors, can be found in products ranging from air-bag triggers in vehicles to displays in the visual arts industry. As these technologies mature, the demands on precision and functionality of MEMS structures have escalated. For example, optimal performance may depend on the ability to fine-tune the characteristics of various components of these MEMS structures. Furthermore, consistency requirements for the performance of MEMS devices (both intra-device and device-to-device) often dictate that the processes used to fabricate such MEMS devices need to be extremely sophisticated.

MEMS resonators are also becoming more prevalent. For example, a clocking device for an integrated circuit (IC) may be based on a MEMS resonator. However, if not compensated, the resonance frequency of the resonator member in such a MEMS structure may vary with temperature. Thus, a MEMS resonator may be unable to meet the specifications for frequency stability over the range of ambient temperatures needed for a particular application or may be unreliable for use in devices that generate varying levels of heat during operation. FIGS. 1A-1B illustrate isometric views representing a MEMS structure having a non-compensated resonator member responding to an increase in temperature, in accordance with the prior art.

Referring to FIG. 1A, a MEMS structure 100 includes a resonator member 104 attached to a substrate 102. Substrate 102 is composed of a material having a first coefficient of thermal expansion (CTE1) and MEMS structure 100 is composed of a material having a second coefficient of thermal expansion (CTE2), where CTE2 is greater than CTE1. The material of MEMS structure 100 and, hence, resonator member 104 also has a negative thermal coefficient of frequency (TCf). That is, the resonance frequency of resonator member 104 decreases in response to an increase in temperature. As depicted by the arrows in FIG. 1B, the CTE mismatch (CTE2>CTE1) results in a compressive stress induced on resonator member 104 in response to an increase in temperature. That is, substrate 102 effectively constrains the expansion of resonator member 104. This compressive stress may exacerbate the already decreasing frequency tendency of resonator member 104, due to the negative TCf.

SUMMARY

Embodiments of the present invention include a MEMS structures having a stress-inducer temperature-compensated resonator member. In an embodiment, a MEMS structure includes a frame disposed above a substrate. The frame has an inner surface and an outer surface and is composed of a first material having a first coefficient of thermal expansion (CTE) and a second material having a second CTE, different from the first CTE. A resonator member is coupled to the inner surface of the frame.

In another embodiment, a MEMS structure includes a stress inducer member disposed above a substrate. A resonator member is coupled to the stress-inducer member. The resonator member is, in one plane, completely surrounded by the stress inducer member.

In yet another embodiment, a method for altering the thermal coefficient of frequency of a MEMS structure is described. The method includes providing a resonator member housed in a stress inducer member disposed above a substrate. The stress inducer member is composed of a first material having a first CTE and a second material having a second CTE, different from the first CTE. The resonator member is composed of the first material. The method further includes inducing a stress on the resonator member with the stress inducer member, in response to a change in temperature.

DETAILED DESCRIPTION

Figure 1A:
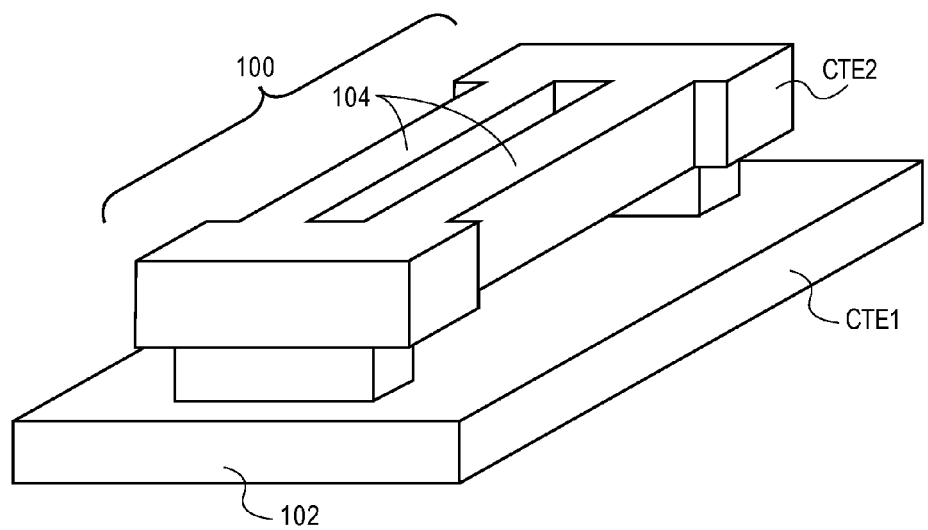
FIGS. 1A-1B illustrate isometric views representing a MEMS structure having a non-compensated resonator member responding to an increase in temperature, in accordance with the prior art.
Figure 1B:
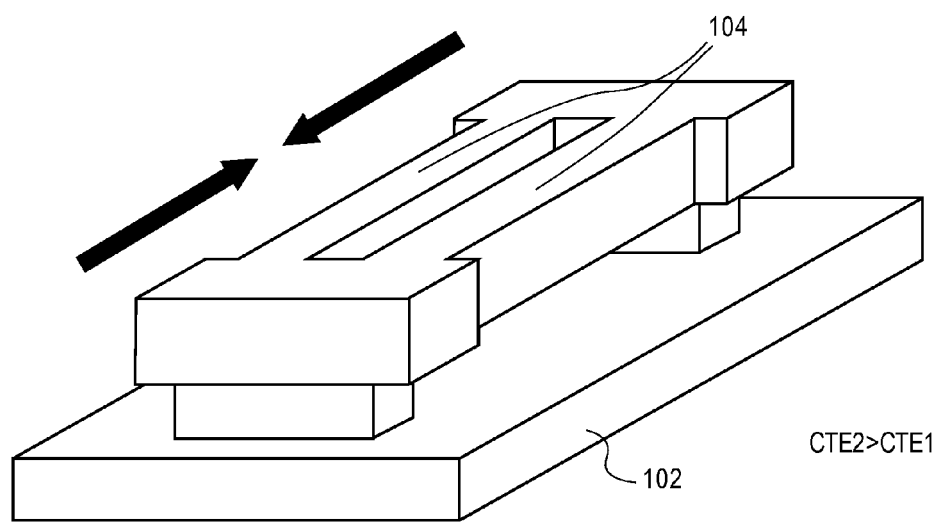

MEMS structures having stress-inducer temperature-compensated resonator members are described. In the following description, numerous specific details are set forth, such as material compositions, in order to provide a thorough understanding of embodiments of the present invention. It will be apparent to one skilled in the art that embodiments of the present invention may be practiced without these specific details. In other instances, well-known features, such as specific fabrication processes, are not described in detail in order to not unnecessarily obscure embodiments of the present invention. Furthermore, it is to be understood that the various embodiments shown in the Figures are illustrative representations and are not necessarily drawn to scale.

Disclosed herein is a MEMS structure having a stress-inducer temperature-compensated resonator member. In an aspect of the present invention, the MEMS structure may include a frame disposed above a substrate. In one embodiment, the frame has an inner surface and an outer surface and is composed of a first material having a first coefficient of thermal expansion (CTE) and a second material having a second CTE, different from the first CTE. A resonator member may be coupled to the inner surface of the frame. In another aspect of the present invention, the MEMS structure may include a stress inducer member disposed above a substrate. In one embodiment, a resonator member is coupled to the stress-inducer member. The resonator member may be, in one plane, completely surrounded by the stress inducer member.

A MEMS structure having a stress-inducer temperature-compensated resonator member may exhibit enhanced performance and reliability for a MEMS clocking device that incorporates such a MEMS structure. For example, in accordance with an embodiment of the present invention, a MEMS resonator structure includes a resonator member having a resonance frequency that changes in correlation with a change in temperature, i.e. it has a non-zero thermal coefficient of frequency (TCf). The non-zero TCf may result from a combination of material properties and residual stress from fabrication. In an embodiment, a stress inducer member is used to house a resonator member and to induce a stress on the resonator member in response to a change in temperature. In one embodiment, the induced stress is used to reduce the magnitude of the TCf of the resonator member. In a specific embodiment, the magnitude of the induced stress is selected to substantially counter the TCf of the resonator member in order to approximately fix the resonance frequency of the resonator member throughout a selected temperature range. In a particular embodiment, a resonator member has a negative TCf and, in response to an increase in temperature, a stress inducer member induces a tensile stress on the resonator member to counter the negative TCf of the resonator member. In accordance with an embodiment of the present invention, a stress inducer member includes a composite frame having a first material of a first CTE and a second material of a second CTE, different from the first CTE.

Figure 2:
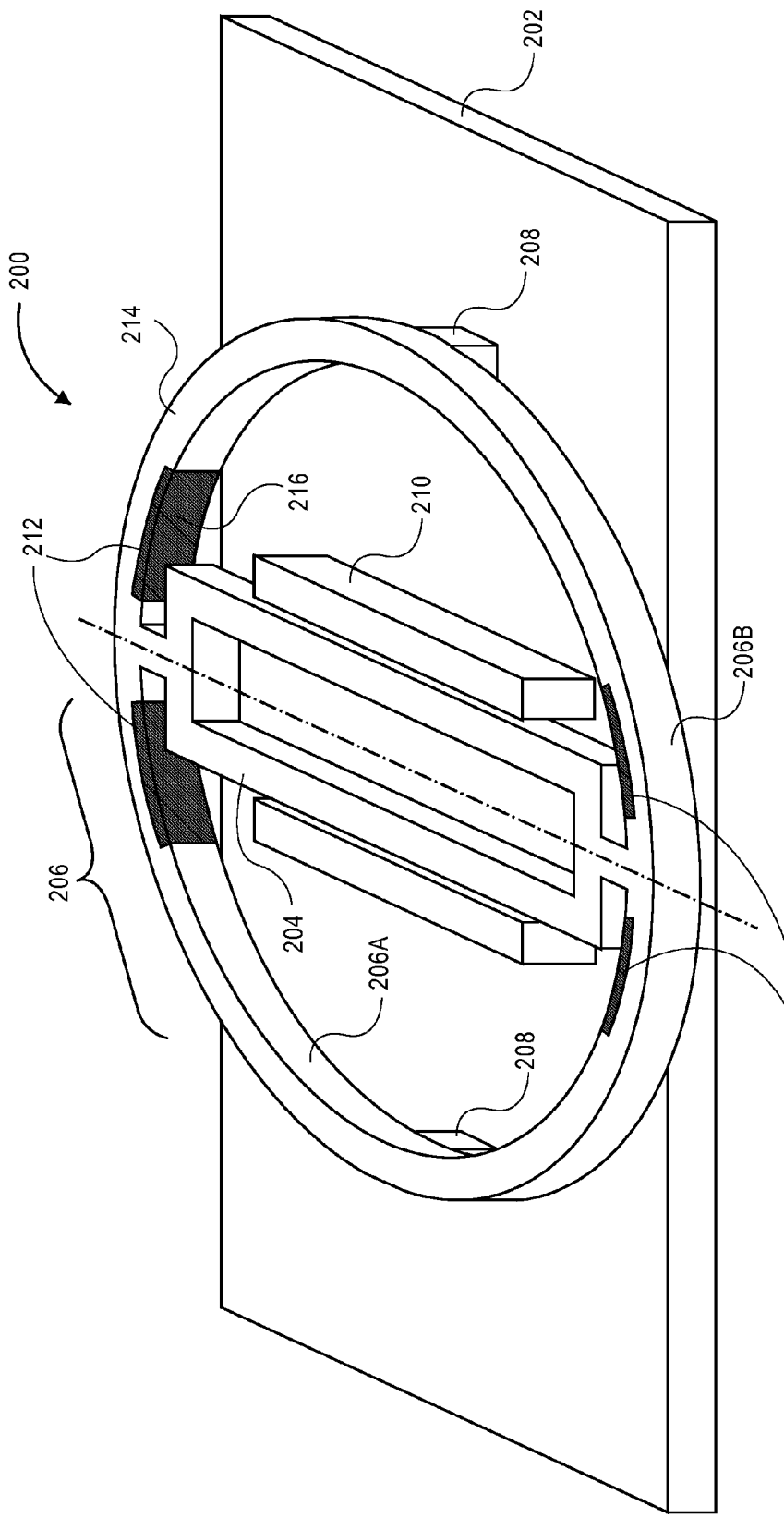
FIG. 2 illustrates an isometric view representing a MEMS structure having a composite frame, in accordance with an embodiment of the present invention.

A MEMS structure may be fabricated to provide a resonator member housed in composite frame. FIG. 2 illustrates an isometric view representing a MEMS structure having a composite frame, in accordance with an embodiment of the present invention.

Referring to FIG. 2, a MEMS structure 200 includes a frame 206 disposed above a substrate 202. Frame 206 has an inner surface 206A and an outer surface 206B. MEMS structure 200 also includes a resonator member 204 coupled to inner surface 206A of frame 206. In one embodiment, frame 206 is coupled to substrate 202 via one or more anchors 208, as depicted in FIG. 2. In an embodiment, a pair of electrodes 210 is coupled to substrate 202, on either side of resonator member 204, as is also depicted in FIG. 2.

MEMS structure 200 may be a device that falls within the scope of MEMS technologies. For example, MEMS structure 200 may be a mechanical and electronic structure having a critical dimension of less than approximately 250 microns and fabricated using lithography, deposition, and etching processes performed on or above a substrate. In accordance with an embodiment of the present invention, MEMS structure 200 is a device such as, but not limited to, a clock, a sensor, a detector or a mirror. In one embodiment, MEMS structure 200 is a clocking device utilizing the resonance frequency of resonator member 204.

Resonator member 204 of MEMS structure 200 may be a feature having a mode with a resonance frequency changeable by an applied stress. For example, in an embodiment, resonator member 204 is coupled to frame 206 at two opposing points which form an axis 220 parallel with the longest dimension of resonator member 204, as depicted in FIG. 2. In one embodiment, resonator member 204 is a double-ended tuning fork, e.g., a resonator member including two parallel beams, as is also depicted in FIG. 2. Resonator member 204 may have dimensions suitable for a desired MEMS function. For example, in accordance with an embodiment of the present invention, MEMS structure 200 is a MEMS resonator structure including a tuning fork resonator member 204. In one embodiment, the length of each beam of resonator member 204 is approximately in the range of 1-250 microns, the thickness of each beam of resonator member 204 is approximately in the range of 0.1-10 microns, the width of each beam of resonator member 204 is approximately in the range of 0.1-100 microns, and the relative lateral separation between the two parallel beams is approximately in the range of 0.01-1 times the length of the beams. In a specific embodiment, the length of each beam of resonator member 204 is approximately in the range of 70-90 microns, the thickness of each beam of resonator member 204 is approximately in the range of 0.5-5 microns, the width of each beam of resonator member 204 is approximately in the range of 0.5-5 microns, and the distance between the two parallel beams is approximately in the range of 0.5-25 microns. In an embodiment, resonator member 204 is disposed above substrate 202 at a distance approximately in the range of 0.1-5 microns.

In accordance with an embodiment of the present invention, frame 206, which houses resonator member 204, is composed of a first material 214 having a first CTE and a second material 216 having a second CTE, different from the first CTE. Thus, frame 206 may be a composite frame, i.e. a frame composed of two or more materials. In an embodiment, second material 216 is contained within a plurality of trenches 212 disposed in first material 214 of frame 206, as depicted in FIG. 2. First material 214 and second material 216 may be selected to have differing CTEs from one another. For example, in an embodiment, the CTE of second material 216 is less than the CTE of first material 214 of frame 206. In an alternative embodiment, the CTE of second material 216 is greater than the CTE of first material 214 of frame 206. The selection of the specific CTE mismatch between first material 214 and second material 216 may be based on the desired function of frame 206, e.g., as described below in association with FIG. 3B and other embodiments.

Frame 206 may be formed from materials suitable for MEMS fabrication. For example, in accordance with an embodiment of the present invention, first material 214 of frame 206 is composed of a semiconductor material such as, but not limited to, silicon, germanium, diamond, silicon-germanium, carbon-doped silicon, carbon-doped silicon-germanium or a III-V material. In one embodiment, first material 214 of frame 206 is composed of polycrystalline silicon-germanium. The semiconductor material may also include dopant impurity atoms. For example, in a specific embodiment, first material 214 of frame 206 is composed of polycrystalline silicon-germanium with a germanium atomic concentration approximately in the range of 50-70% and boron dopant impurity atoms with a total atomic concentration approximately in the range of $1\times10^{18}$-$5\times10^{20}$ atoms/cm$^3$. In accordance with an embodiment of the present invention, second material 216 of frame 206 is composed of an insulator material such as, but not limited to, silicon dioxide, silicon nitride, silicon oxy-nitride or a high-k dielectric material. Thus, in an embodiment, first material 214 of frame 206 is a semiconductor and second material 216 of frame 206 is a dielectric. In one embodiment, first material 214 is composed of at least one of silicon and germanium and second material 216 is composed of silicon dioxide. It is to be understood, however, that any material combination where the CTEs differ may be suitable for the compositions of first material 214 and second material 216 of frame 206. For example, in an alternative embodiment, first material 214 of frame 206 is a dielectric and second material 216 of frame 206 is a semiconductor. Also, for ease of fabrication, the material compositions of frame 206 may be the same or approximately the same as the material compositions of other features of MEMS structure 200. For example, in an embodiment, resonator member 204 and first material 214 of frame 206 are composed of the same or approximately the same material such as, but not limited to, silicon-germanium.

As mentioned above, in an embodiment, second material 216 is contained within a plurality of trenches 212 disposed in first material 214 of frame 206, as depicted in FIG. 2. The positioning and number of the plurality of trenches 212 within frame 206 may be based on the desired function of frame 206, e.g., as described below in association with FIG. 3B and other embodiments. However, even within the context of such positioning, there are options for the arrangement of second material 216 with respect to first material 214 of frame 206. For example, in one embodiment, second material 216 is exposed at inner surface 206A of frame 206, as depicted in FIG. 2. That is, the plurality of trenches 212 is located at the inside edge of frame 206. In another embodiment, second material 216 is exposed at outer surface 206B of frame 206. That is, the plurality of trenches 212 is located at the outside edge of frame 206. In yet another embodiment, second material 216 is exposed at both inner surface 206A and outer surface 206B of frame 206. For example, in that embodiment, a first plurality of trenches 212 is located at the inside edge of frame 206 while a second plurality of trenches is located at the outside edge of frame 206. In accordance with another embodiment of the present invention, second material 216 of frame 206 is closer to either the inside or the outside edge of frame 206, but is not exposed at either the inside or the outside edge.

Frame 206 may be a stress inducer member for MEMS structure 200. Thus, in accordance with an embodiment of the present invention and referring again to FIG. 2, frame 206 is a stress inducer member disposed above substrate 202. Resonator member 204 is coupled to the stress inducer member and is stressed by stress inducer member along axis 220. In an embodiment, resonator member 204 is, in one plane, completely surrounded by the stress inducer member. For example, in one embodiment, the stress inducer member is a ring that completely surrounds resonator member 204 in a plane parallel with the plane of the top surface of substrate 202, as depicted in FIG. 2. The stress inducer member may be composed of a first material having a first CTE and a second material having a second CTE, different than the first CTE. In an embodiment, the second CTE is less than the first CTE. In one embodiment, the second material is contained within a plurality of trenches disposed in the first material of the stress inducer member, as depicted in FIG. 2. In a specific embodiment, at least one of the plurality of trenches is exposed at a surface of the stress inducer member, in the same plane as resonator member 204. In another specific embodiment, none of the plurality of trenches is exposed at a surface of the stress inducer member, in the same plane as resonator member 204.

Substrate 202 may be composed of a material suitable for MEMS fabrication processes and suitable to provide structural integrity for MEMS structure 200. In an embodiment, substrate 202 is composed of group IV-based materials such as, but not limited to, crystalline silicon, germanium, or silicon-germanium. In another embodiment, substrate 202 is composed of a III-V material. Substrate 202 may also include an insulator layer. In one embodiment, the insulator layer is composed of a material such as, but not limited to, silicon dioxide, silicon nitride, silicon oxy-nitride, or a high-k dielectric layer. Substrate 202 may itself be composed of an insulator material. In one embodiment, substrate 202 is composed of a material such as, but not limited to, glass, quartz or sapphire. Substrate 202 may include a fabricated integrated circuit formed therein or thereon. For example, in accordance with an embodiment of the present invention, substrate 202 includes an insulator layer disposed above a plurality of interconnect structures which connect a plurality of micro-electronic devices. In such an embodiment, MEMS structure 200 may be fabricated above the insulator layer. In one embodiment, the plurality of micro-electronic devices is a plurality of N-type and P-type transistors and the plurality of interconnect structures is a plurality of metal interconnects that tie the plurality of N-type and P-type transistors into an integrated circuit.

Substrate 202 may be coupled with frame 206 such that any stress between substrate 202 and frame 206 is substantially decoupled from frame 206. Thus in accordance with an embodiment of the present invention, aside from the expansion or contraction forces correlating with the CTE of the materials of frame 206, frame 206 is not itself significantly acted upon by external stresses in response to a change in temperature. In an embodiment, MEMS structure 200 includes one or more anchors 208, each anchor coupled to frame 206 and to substrate 202, as depicted in FIG. 2. In that embodiment, resonator member 204 is suspended above substrate 202, as is also depicted in FIG. 2. In the case that frame 206 is coupled to substrate 202 by such anchors, the anchors may be arranged as to hinder any stress external to frame 206, e.g. CTE mismatch between substrate 202 and frame 206, from affecting frame 206. For example, in one embodiment, only one anchor is used to couple frame 206 to substrate 202, effectively decoupling frame 206 from any external stresses that would otherwise be induced by substrate 202. Other embodiments for decoupling frame 206 from external stresses that would otherwise result from CTE mismatch between substrate 202 and frame 206 are described below, in association with FIGS. 8, 9 and 10A-10C. In another embodiment, the CTEs of the materials of substrate 202 and frame 206 are selected to be approximately the same, such that CTE mismatch stress between substrate 202 and frame 206 is negligible in response to a change in temperature.

In the embodiment depicted in FIG. 2, resonator member 204 is driven and sensed electrostatically by the adjacent pair of electrodes 210. However, any means suitable to sustain the motion of resonator member 204 may be used, such as but not limited to thermal, piezoelectric, piezoresistive or optical means. The pair of electrodes 210 may be composed of a material suitable to act as drive and sense electrodes for resonator member 204 and suitable for MEMS fabrication. For example, in accordance with an embodiment of the present invention, the pair of electrodes 210 is composed of a material such as, but not limited to, a semiconductor material heavily doped with charge-carrier impurity atoms, or a conductor. In one embodiment, the pair of electrodes 210 is composed of a heavily doped semiconductor material such as, but not limited to, silicon, germanium, silicon-germanium, carbon-doped silicon, carbon-doped silicon-germanium, or a III-V material. In a specific embodiment, the pair of electrodes 210 is composed of a group IV material and is heavily doped with charge-carrier impurity atoms such as, but not limited to, boron, indium, phosphorus, arsenic, or antimony. In an embodiment, the pair of electrodes 210 is composed of approximately the same material as resonator member 204.

Figure 3A:
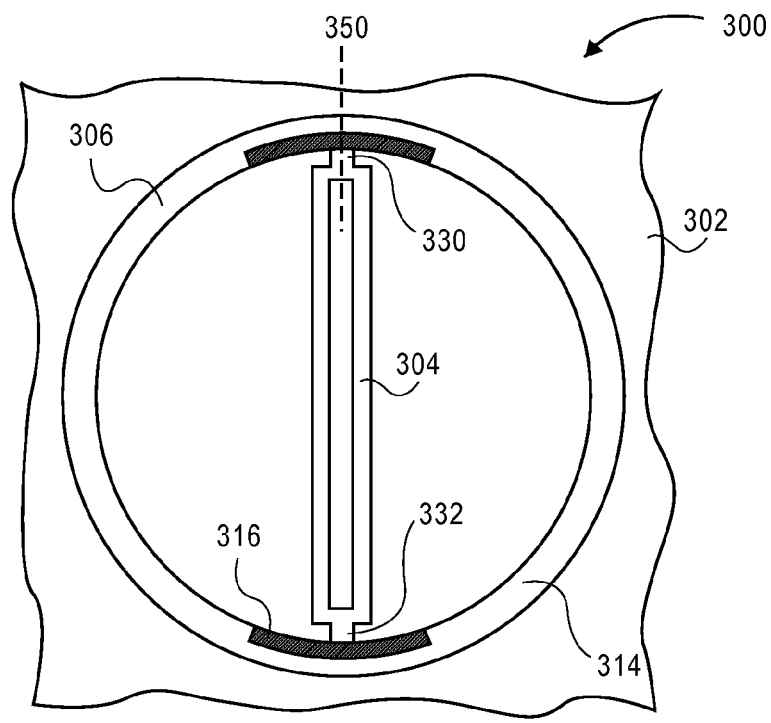
FIG. 3A illustrates a plan view representing a MEMS structure having a circular composite frame with filled trenches parallel with the axis of a resonator member housed in the composite frame, in accordance with an embodiment of the present invention.

A composite frame having materials with differing CTEs may be used as a stress inducer to compensate for the TCf of a resonator member in a MEMS structure. FIG. 3A illustrates a plan view representing a MEMS structure having a circular composite frame with filled trenches parallel with the axis of a resonator member housed in the composite frame, in accordance with an embodiment of the present invention.

Referring to FIG. 3A, a MEMS structure 300 is disposed above a substrate 302. MEMS structure 300 includes a resonator member 304 housed in a frame 306 along an axis 350. In an embodiment, frame 306 has a ring shape, as depicted in FIG. 3A. For convenience, drive and sense electrodes are not depicted. Also, FIG. 3A does not depict the means by which frame 306 is coupled with substrate 302. Frame 306 may be coupled with substrate 302 by an approach such as the approaches described herein with respect to other embodiments of the present invention. In accordance with an embodiment of the present invention, frame 306 is a composite frame composed of a first material 314 and a second material 316 having differing CTEs, and second material 316 is contained within a pair of trenches, as depicted in FIG. 3A. In one embodiment, the CTE of second material 316 is less than the CTE of first material 314. In an embodiment, resonator member 304 has a negative TCf such that the resonance frequency of resonator member 304 would otherwise decrease with increasing temperature.

Figure 3B:
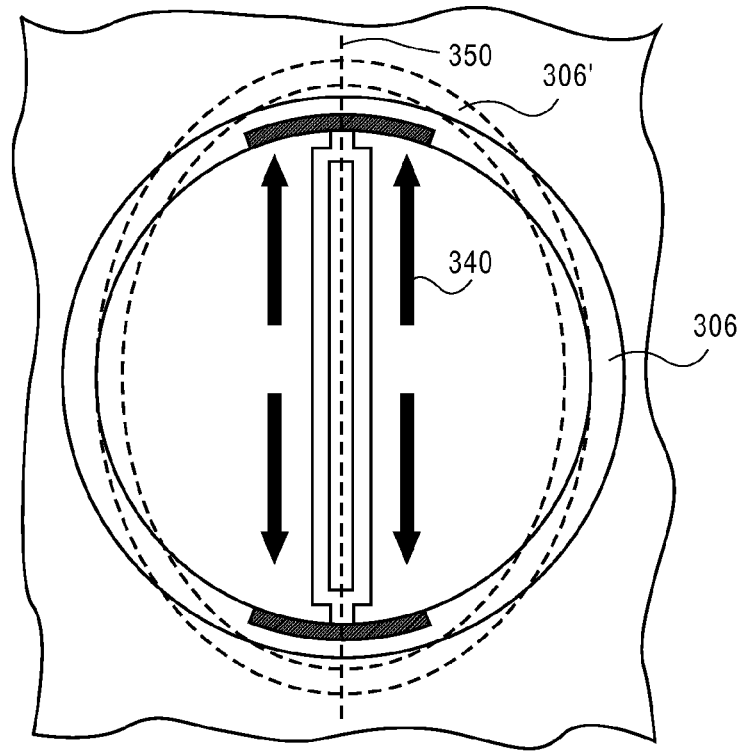
FIG. 3B illustrates a plan view representing the MEMS structure of FIG. 3A responding to a change in temperature, in accordance with an embodiment of the present invention.

FIG. 3B illustrates a plan view representing the MEMS structure of FIG. 3A responding to a change in temperature, in accordance with an embodiment of the present invention. Referring to FIG. 3B, frame 306 responds to a changing temperature by deforming in shape parallel with axis 350, as depicted by the dashed elliptical shape 306'. In one embodiment, the shape and positioning of a region of frame 306 is altered in response to an increase in temperature. For example, in a specific embodiment, second material 316 has a CTE less than the CTE of first material 314 and therefore expands less in response to an increase in temperature than does first material 314. Accordingly, the regions of frame 306 composed of second material 316 expand less than those regions composed of first material 314 and, thus, frame 306 deforms from its original ring shape. As a consequence of second material 316 being incorporated proximate to the inner edge of frame 306 and parallel with the axis of resonator member 304, the deformation resulting from the CTE mismatch results in a tensile stress induced on resonator member 304 in response to an increase in temperature, as depicted by the arrows 340. In an embodiment, the tensile stress induced on resonator member 304 counters a negative TCf otherwise characteristic of resonator member 304. In one embodiment, the tensile stress induced on resonator member 304 approximately cancels the effects of a negative TCf otherwise characteristic of resonator member 304, maintaining approximately the same resonance frequency for resonator member 304 across a range of temperatures. Thus, in accordance with an embodiment of the present invention, resonator member 304 is a temperature-compensated resonator member.

Resonator member 304 of FIGS. 3A and 3B is depicted as being coupled to frame 306 at a first point 330 and a second point 332, forming axis 350. In one embodiment, a pair of trenches containing second material 316 is positioned approximately parallel with axis 350. In a specific embodiment, the pair of trenches is proximate to the inner surface of frame 306 and distant from the outer surface of frame 306. In a particular embodiment, frame 306 completely surrounds resonator member 304 in a plane of resonator member 304 and the pair of trenches is in that same plane, as is also depicted in FIGS. 3A and 3B. It is to be understood that although resonator member 304 is depicted as being coupled directly to second material 316, it may be the case that second material 316 is inset from the inner edge of frame 306 and, hence, resonator member 304 may be coupled directly to first material 314 of frame 306. When the CTE of second material 316 is less than the CTE of first material 314, the depicted arrangement allows frame 306 to act as a tensile stress inducer for resonator member 304 in response to an increasing temperature. However, other arrangements for second material 316 may be utilized, depending on the stress-inducing characteristic desired, as described below in association with other embodiments of the present invention. Also, each of the trenches of the pair of trenches may itself represent a plurality of trenches.

A composite frame having materials with differing CTEs may be designed to have different positional relationships for the materials than the arrangement described in association with FIGS. 3A and 3B. For example, FIG. 4 illustrates a plan view representing a MEMS structure having a composite frame with filled trenches perpendicular to the axis of a resonator member housed in the composite frame, in accordance with an embodiment of the present invention.

Figure 4:
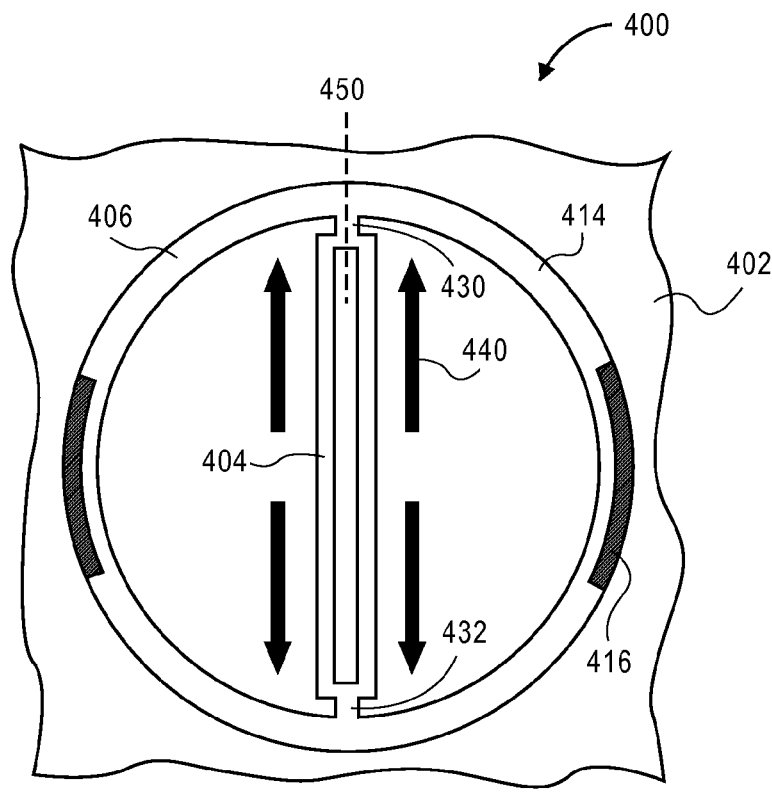
FIG. 4 illustrates a plan view representing a MEMS structure having a composite frame with filled trenches perpendicular to the axis of a resonator member housed in the composite frame, in accordance with an embodiment of the present invention.

Referring to FIG. 4, a MEMS structure 400 is disposed above a substrate 402. MEMS structure 400 includes a resonator member 404 housed in a frame 406. In an embodiment, frame 406 has a ring shape, as depicted in FIG. 4. For convenience, drive and sense electrodes are not depicted. Also, FIG. 4 does not depict the means by which frame 406 is coupled with substrate 402. Frame 406 may be coupled with substrate 402 by an approach such as the approaches described herein with respect to other embodiments of the present invention. In accordance with an embodiment of the present invention, frame 406 is a composite frame composed of a first material 414 and a second material 416 having differing CTEs and second material 416 is contained within a pair of trenches, as depicted in FIG. 4. In one embodiment, the CTE of second material 416 is less than the CTE of first material 414. In an embodiment, resonator member 404 has a negative TCf such that the resonance frequency of resonator member 404 would otherwise decrease with increasing temperature.

Resonator member 404 of FIG. 4 is depicted as being coupled to frame 406 at a first point 430 and a second point 432, forming an axis 450. In one embodiment, a pair of trenches containing second material 416 is positioned approximately perpendicular with axis 450, as depicted in FIG. 4. In a specific embodiment, the pair of trenches is proximate to the outer surface of frame 406 and distant from the inner surface of frame 406. In a particular embodiment, frame 406 completely surrounds resonator member 404 in a plane of resonator member 404 and the pair of trenches is in that same plane, as is also depicted in FIG. 4. In accordance with an embodiment of the present invention, frame 406 responds to a changing temperature by deforming in shape parallel with axis 450, similar to the deformation described in association with FIG. 3B. For example, in one embodiment, second material 416 has a CTE less than the CTE of first material 414 and therefore expands less in response to an increase in temperature than does first material 414. Accordingly, the regions of frame 406 that are composed of second material 416 expand less than those regions composed of first material 414 and, thus, frame 406 deforms from its original ring shape. As a consequence of second material 416 being incorporated proximate to the outer edge of frame 406 and perpendicular to axis 450 of resonator member 404, the deformation resulting from the CTE mismatch results in a tensile stress induced on resonator member 404 in response to an increase in temperature, as depicted by the arrows 440. Thus, when the CTE of second material 416 is less than the CTE of first material 414, the depicted arrangement allows frame 406 to act as a tensile stress inducer for resonator member 404 in response to an increasing temperature. In an embodiment, the tensile stress induced on resonator member 404 counters a negative TCf otherwise characteristic of resonator member 404. In one embodiment, the tensile stress induced on resonator member 404 approximately cancels the effects of a negative TCf otherwise characteristic of resonator member 404, maintaining approximately the same resonance frequency for resonator member 404 across a range of temperatures. Thus, in accordance with an embodiment of the present invention, resonator member 404 is a temperature-compensated resonator member.

A composite frame having materials with differing CTEs may be designed to have more than only two locations or groups of locations for one of the materials in relation to the other material, in contrast to the arrangements described in association with FIGS. 3A and 4. For example, FIG. 5 illustrates a plan view representing a MEMS structure having a composite frame with filled trenches both parallel with and perpendicular to the axis of a resonator member housed in the composite frame, in accordance with an embodiment of the present invention.

Figure 5:
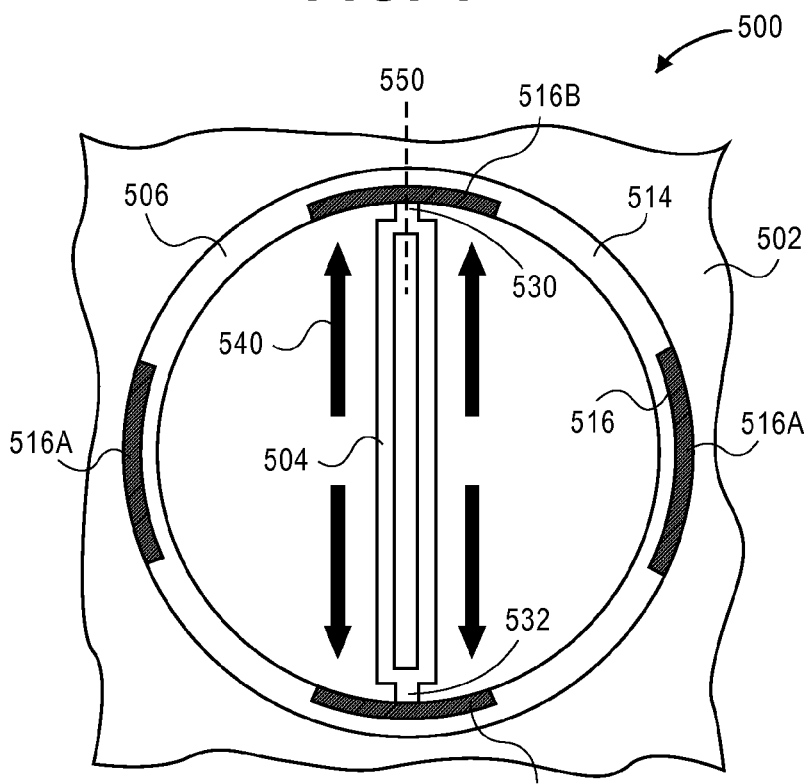
FIG. 5 illustrates a plan view representing a MEMS structure having a composite frame with filled trenches both parallel with and perpendicular to the axis of a resonator member housed in the composite frame, in accordance with an embodiment of the present invention.

Referring to FIG. 5, a MEMS structure 500 is disposed above a substrate 502. MEMS structure 500 includes a resonator member 504 housed in a frame 506. In an embodiment, frame 506 has a ring shape, as depicted in FIG. 5. For convenience, drive and sense electrodes are not depicted. Also, FIG. 5 does not depict the means by which frame 506 is coupled with substrate 502. Frame 506 may be coupled with substrate 502 by an approach such as the approaches described herein with respect to other embodiments of the present invention. In accordance with an embodiment of the present invention, frame 506 is a composite frame composed of a first material 514 and a second material 516 having differing CTEs, and second material 516 is contained within two pairs of trenches, as depicted in FIG. 5. In one embodiment, the CTE of second material 516 is less than the CTE of first material 514. In an embodiment, resonator member 504 has a negative TCf such that the resonance frequency of resonator member 504 would otherwise decrease with increasing temperature.

Resonator member 504 of FIG. 5 is depicted as being coupled to frame 506 at a first point 530 and a second point 532, forming an axis 550. In one embodiment, a first pair of trenches 516A containing second material 516 is positioned approximately perpendicular with axis 550 while a second pair of trenches 516B containing second material 516 is positioned approximately parallel with axis 550, as depicted in FIG. 5. In a specific embodiment, the first pair of trenches 516A is proximate to the outer surface of frame 506 and distant from the inner surface of frame 506 while the second pair of trenches 516B is proximate to the inner surface of frame 506 and distant from the outer surface of frame 506, as is also depicted in FIG. 5. In accordance with an embodiment of the present invention, frame 506 responds to a changing temperature by deforming in shape parallel with axis 550, similar to the deformation described in association with FIG. 3B. For example, in one embodiment, second material 516 has a CTE less than the CTE of first material 514 and therefore expands less in response to an increase in temperature than does first material 514. Accordingly, the regions of frame 506 that are composed of second material 516 expand less than those regions composed of first material 514 and, thus, frame 506 deforms from its original ring shape. In an embodiment, second material 516 is incorporated, in one instance, proximate to the outer edge of frame 506 and perpendicular to axis 550 of resonator member 504, and in another instance, proximate to the inner edge of frame 506 and parallel with axis 550 of resonator member 504. Consequently, as depicted by the arrows 540, the deformation resulting from the CTE mismatch results in a tensile stress induced on resonator member 504 in response to an increase in temperature. Thus, when the CTE of second material 516 is less than the CTE of first material 514, the depicted arrangement allows frame 506 to act as a tensile stress inducer for resonator member 504 in response to an increasing temperature.

It is to be understood that the arrangement of a second material in a frame of a first material is not limited to positions parallel with or perpendicular to the longest axis of a resonator member housed in the frame, as described in association with FIGS. 3A-5. For example, in an alternative embodiment, trenches of the second material are arranged at angles between 0 degrees and 90 degrees to the longest axis of the resonator member. Also, the trenches need not be circular arcs or need not directly conform to the shape of the frame. Furthermore, the shape of the frame is not limited to a ring shape. For example, FIG. 6A illustrates a plan view representing a MEMS structure having a square composite frame, in accordance with an embodiment of the present invention.

Figure 6A:
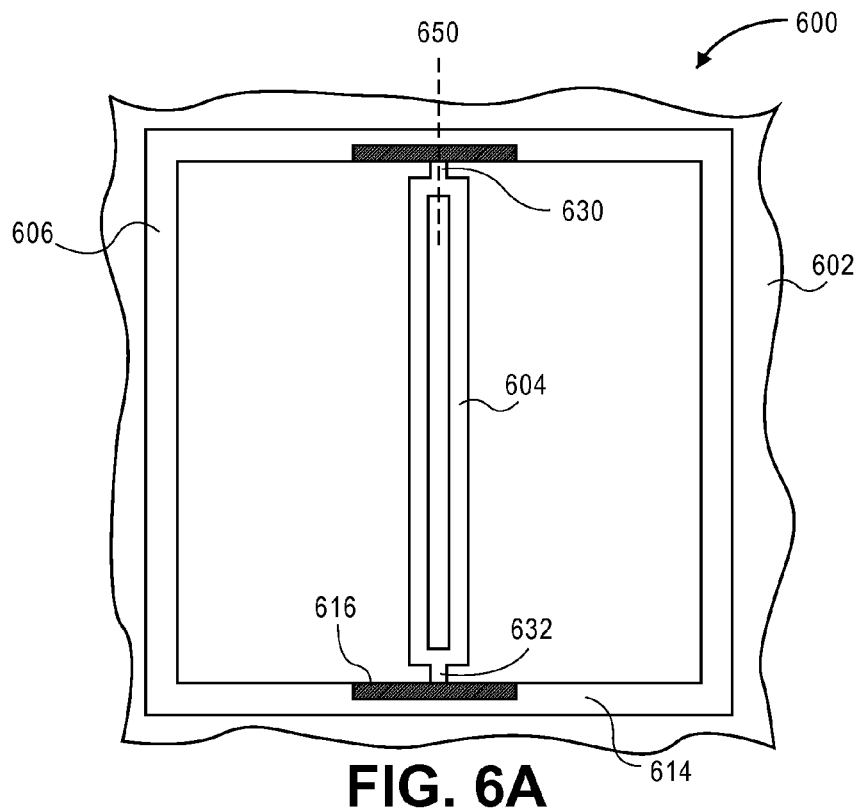
FIG. 6A illustrates a plan view representing a MEMS structure having a square composite frame, in accordance with an embodiment of the present invention.

Referring to FIG. 6A, a MEMS structure 600 is disposed above a substrate 602. MEMS structure 600 includes a resonator member 604 housed in a frame 606 along an axis 650. In an embodiment, frame 606 has a square shape, as depicted in FIG. 6A. For convenience, drive and sense electrodes are not depicted. Also, FIG. 6A does not depict the means by which frame 606 is coupled with substrate 602. Frame 606 may be coupled with substrate 602 by an approach such as the approaches described herein with respect to other embodiments of the present invention. In accordance with an embodiment of the present invention, frame 606 is a composite frame composed of a first material 614 and a second material 616 having differing CTEs. Second material 616 is contained within a pair of trenches, as depicted in FIG. 6A. In one embodiment, the CTE of second material 616 is less than the CTE of first material 614. In an embodiment, resonator member 604 has a negative TCf such that the resonance frequency of resonator member 604 would otherwise decrease with increasing temperature.

Figure 6B:
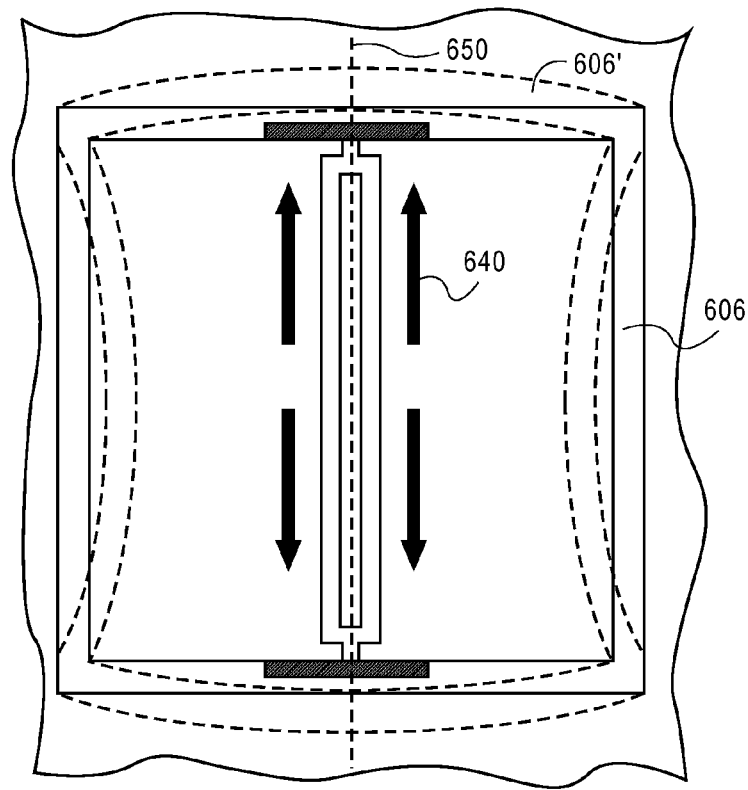
FIG. 6B illustrates a plan view representing the MEMS structure of FIG. 6A responding to a change in temperature, in accordance with an embodiment of the present invention.

FIG. 6B illustrates a plan view representing the MEMS structure of FIG. 6A responding to a change in temperature, in accordance with an embodiment of the present invention. Referring to FIG. 6B, frame 606 responds to a changing temperature by deforming in shape, as depicted by the dashed deformed square shape 606'. In one embodiment, the shape and positioning of a region of frame 606 is altered in response to an increase in temperature. For example, in a specific embodiment, second material 616 has a CTE less than the CTE of first material 614 and therefore expands less in response to an increase in temperature than does first material 614. Accordingly, the regions of frame 606 composed of second material 616 expand less than those regions composed of first material 614 and, thus, frame 606 deforms from its original square shape. As a consequence of second material 616 being incorporated proximate to the inner edge of frame 606 and parallel with axis 650 of resonator member 604, the deformation resulting from the CTE mismatch results in a tensile stress induced on resonator member 604 in response to an increase in temperature, as depicted by the arrows 640. In an embodiment, the tensile stress induced on resonator member 604 counters a negative TCf otherwise characteristic of resonator member 604. In one embodiment, the tensile stress induced on resonator member 604 approximately cancels the effects of a negative TCf otherwise characteristic of resonator member 604, maintaining approximately the same resonance frequency for resonator member 604 across a range of temperatures. Thus, in accordance with an embodiment of the present invention, resonator member 604 is a temperature-compensated resonator member.

Resonator member 604 of FIGS. 6A and 6B is depicted as being coupled to frame 606 at a first point 630 and a second point 632, forming axis 650. In one embodiment, a pair of trenches containing second material 616 is positioned approximately parallel with the axis. In a specific embodiment, the pair of trenches is proximate to the inner surface of frame 606 and distant from the outer surface of frame 606. In a particular embodiment, frame 606 completely surrounds resonator member 604 in a plane of resonator member 604 and the pair of trenches is in that same plane, as is also depicted in FIGS. 6A and 6B. It is to be understood that although resonator member 604 is depicted as being coupled directly to second material 616, it may be the case that second material 616 is inset from the inner edge of frame 606 and, hence, resonator member 604 may be coupled directly to first material 614 of frame 606. When the CTE of second material 616 is less than the CTE of first material 614, the depicted arrangement allows frame 606 to act as a tensile stress inducer for resonator member 304 in response to an increasing temperature. However, other arrangements for second material 616 may be utilized, depending on the stress-inducing characteristic desired. Also, each of the trenches of the pair of trenches may itself represent a plurality of trenches. Furthermore, it is to be understood that other shapes, such as a rectangle shape, may be considered for the frame that houses a temperature-compensated resonator member.

Figure 7A:
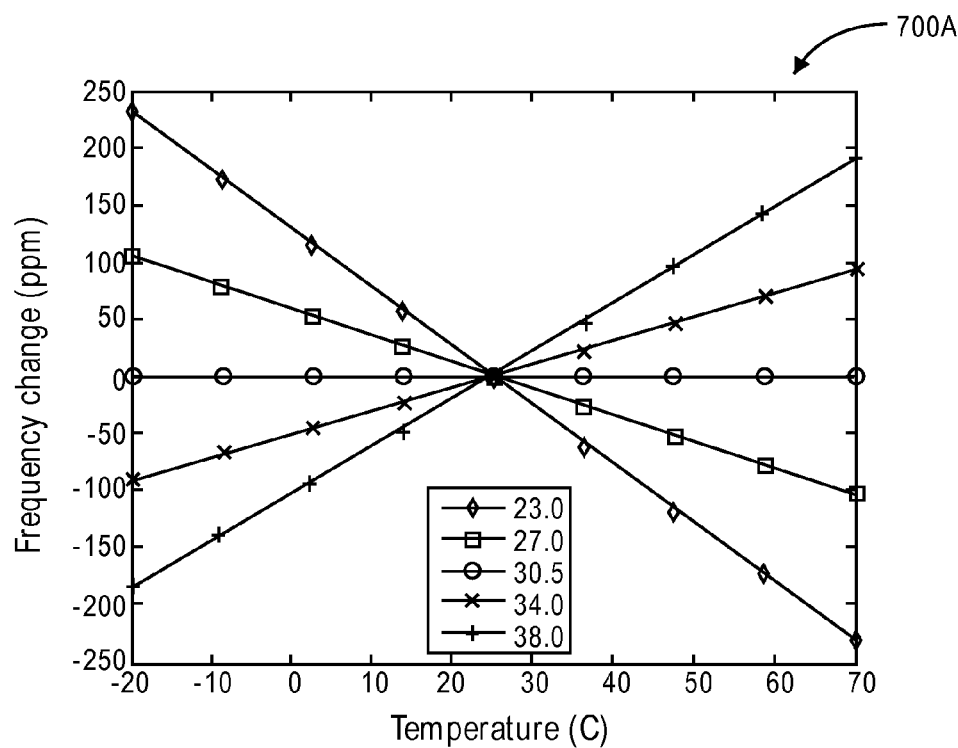
FIG. 7A illustrates a correlation plot of frequency variation as a function of temperature for a series of MEMS structures having circular composite frames, in accordance with an embodiment of the present invention.

As described above, a composite frame may induce a stress on a resonator member to modify, and possibly negate, the TCf otherwise characteristic of the resonator member. Trenches of a second material in a frame composed of a first material may be designed to fine-tune the modification of the TCf. For example, FIG. 7A illustrates a correlation plot 700A of frequency variation as a function of temperature for a series of MEMS structures having circular composite frames, in accordance with an embodiment of the present invention. In another example, FIG. 7B illustrates a correlation plot 700B of frequency variation as a function of temperature for a series of MEMS structures having rectangle-shaped composite frames, in accordance with an embodiment of the present invention.

Referring to FIG. 7A, the temperature response is provided for the frequency of a resonator member, housed in a circular frame having trenches containing a second material with a CTE less than the CTE of the rest of the material of the frame, as a function of the distribution of the second material within the frame. In this example, the beam length of the resonator member is fixed at approximately 69 microns and the beam width is fixed at approximately 1.8 microns. For these dimensions, the anti-symmetric mode (the $11^{th}$ mode) of the resonator member has a frequency of approximately 2.1 MHz. The width of the ring-shaped frame is fixed at approximately 10 microns. Correlation plot 700A plots several correlations for angular extents in degrees, i.e. the portion of the circumference, of the trenches of the second material within the circular frame. The trenches are positioned approximately parallel with longest axis of the resonator member. By varying the angular extent of each of the trenches, the frequency of the resonator member may be adjusted to a desired value. Under the above conditions, the frequency change of the resonator member over the temperature range of –20-70 degrees Celsius can be approximately negated at a trench angular extent of approximately 30.5 degrees. That is, in accordance with an embodiment of the present invention, a TCf of a resonator member is effectively zeroed-out by inducing a stress from a stress-inducer member on the resonator member in response to a changing temperature.

Figure 7B:
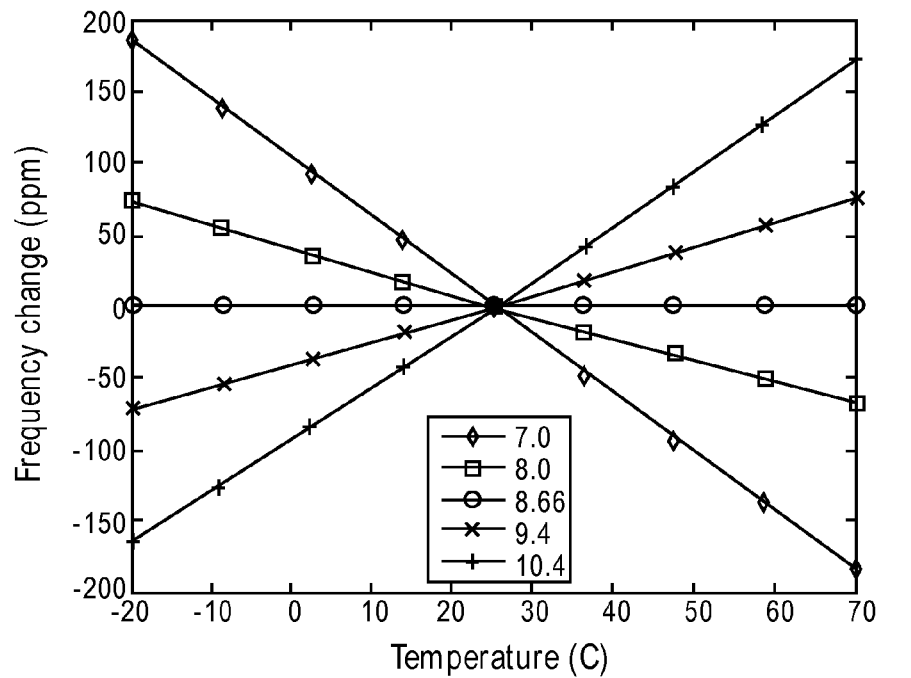
FIG. 7B illustrates a correlation plot of frequency variation as a function of temperature for a series of MEMS structures having rectangle-shaped composite frames, in accordance with an embodiment of the present invention.

Referring to FIG. 7B, the temperature response is provided for the frequency of a resonator member, housed in a rectangle-shaped frame having trenches containing a second material with a CTE less than the CTE of the rest of the material of the frame, as a function of the distribution of the second material within the frame. In this example, the beam length of the resonator member is fixed at approximately 69 microns and the beam width is fixed at approximately 1.8 microns. For these dimensions, the anti-symmetric mode (the $11^{th}$ mode) of the resonator member has a frequency of approximately 2.1 MHz. The rectangle-shaped frame is fixed to have a width of approximately 72 microns and a length of approximately 103 microns. Correlation plot 700B plots correlations for several lengths, in microns, of the trenches of the second material in the rectangle-shaped frame. The trenches are positioned approximately parallel with longest axis of the resonator member. By varying the length of each of the trenches, the frequency of the resonator member may be adjusted to a desired value. Under the above conditions, the frequency change of the resonator member over the temperature range of −20-70 degrees Celsius can be approximately negated at a trench length of approximately 8.66 microns. That is, like the case described in association with FIG. 7A and in accordance with an embodiment of the present invention, a TCf of a resonator member is effectively zeroed-out by inducing a stress from a stress-inducer member on the resonator member in response to a changing temperature.

It is to be understood that embodiments of the present invention are not limited only to a stress inducer used to induce a tensile stress on a resonator member in response to an increasing temperature. For example, in accordance with an embodiment of the present invention, a method is provided for altering the thermal coefficient of frequency of a MEMS structure. In an embodiment, the method includes first providing a resonator member housed in a stress inducer member disposed above a substrate. The stress inducer member is composed of a first material having a first CTE and a second material having a second CTE, different from the first CTE. The method includes next inducing a stress on the resonator member with the stress inducer member in response to a change in temperature. For example, similar to embodiments described above, in one embodiment, inducing the stress includes inducing a tensile stress on the resonator member in response to an increase in temperature. However, in another embodiment, inducing the stress includes inducing a compressive stress on the resonator member in response to a decrease in temperature. In another embodiment, inducing the stress includes inducing a compressive stress on the resonator member in response to an increase in temperature. In yet another embodiment, inducing the stress includes inducing a tensile stress on the resonator member in response to a decrease in temperature. In a specific embodiment, the resonator member is composed of the first material having the first CTE.

Figure 8:
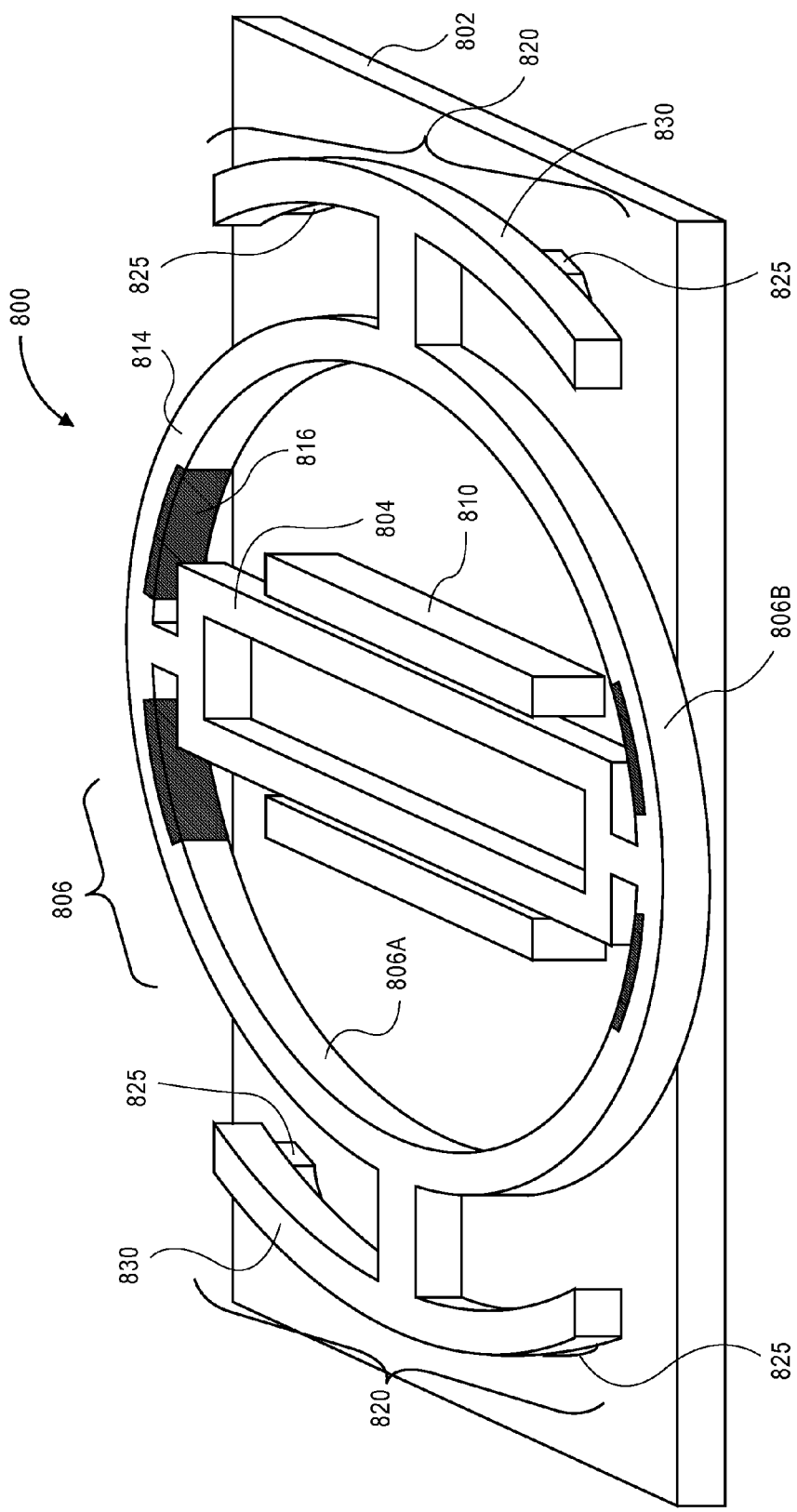
FIG. 8 illustrates an isometric view representing a MEMS structure having a composite frame coupled to a pair of decoupling springs, in accordance with an embodiment of the present invention.
Figure 9:
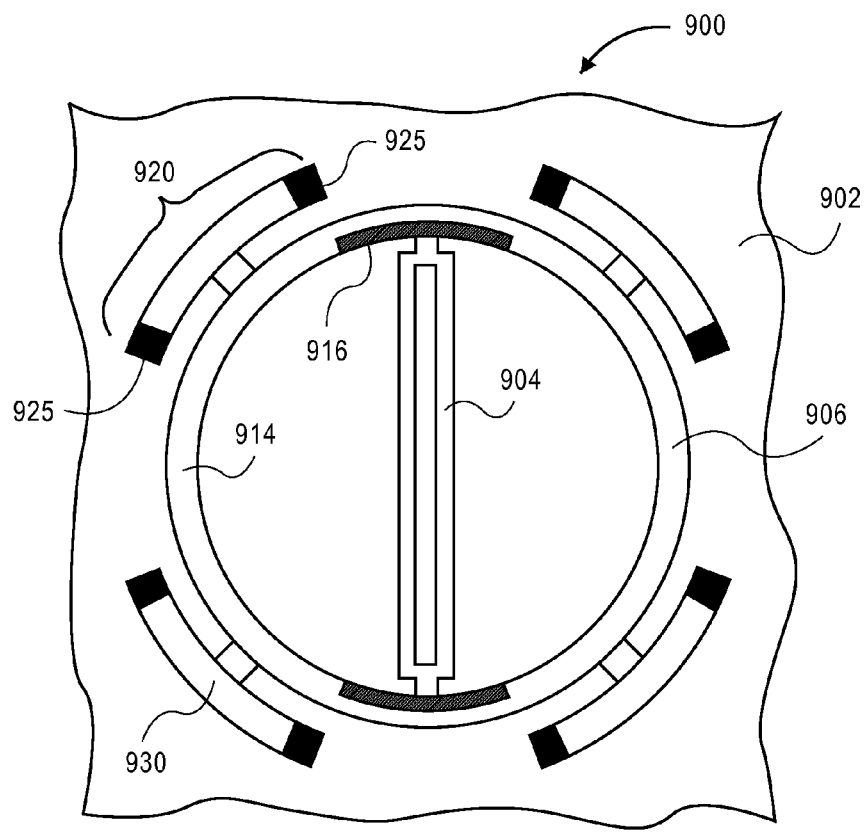
FIG. 9 illustrates a plan view representing a MEMS structure having a circular composite frame coupled to a plurality of decoupling springs, in accordance with an embodiment of the present invention.

In another aspect of the present invention, for performance considerations of a stress inducer member composed of a composite frame, additional features may need to be incorporated into a MEMS structure in order to, as mentioned above, decouple or partially decouple the stress inducer member from an underlying substrate. For example, FIG. 8 illustrates an isometric view representing a MEMS structure having a composite frame coupled to a pair of decoupling springs, in accordance with an embodiment of the present invention. FIG. 9 illustrates a plan view representing a MEMS structure having a circular composite frame coupled to a plurality of decoupling springs, in accordance with an embodiment of the present invention.

Referring to FIG. 8, a MEMS structure 800 includes a frame 806 disposed above a substrate 802. Frame 806 has an inner surface 806A and an outer surface 806B. MEMS structure 800 also includes a resonator member 804 coupled to inner surface 806A of frame 806. In an embodiment, a pair of electrodes 810 is coupled to substrate 802, on either side of resonator member 804, as depicted in FIG. 8. In one embodiment, frame 806 is a composite frame composed of a first material 814 having a CTE greater than a second material 816, which is contained in a plurality of trenches in frame 806. In accordance with an embodiment of the present invention, MEMS structure 800 includes one or more decoupling springs coupled to a composite frame and anchored to a substrate. For example, in one embodiment, frame 806 is coupled to substrate 802 via a pair of decoupling springs 820 which are anchored to substrate 802, as depicted in FIG. 8. Thus, frame 806 is not coupled directly to substrate 802. In a specific embodiment, resonator member 804 is suspended above substrate 802, as is also depicted in FIG. 8.

Decoupling springs 820 may be composed of a material and have an arrangement suitable to mitigate frame 806 from being subject to external stresses that would otherwise result from CTE mismatch between substrate 802 and frame 806. For example, in accordance with an embodiment of the present invention, decoupling springs 820 are composed of approximately the same material as frame 806 with each decoupling spring 820 being anchored at two points to substrate 802 by anchors 825. Suspended beams 830 of each coupling spring 820 are arranged to accommodate any CTE mismatch stresses by deforming in response to such stresses and, hence, dissipating the stresses without measurably affecting frame 806. In one embodiment, suspended beams 830 are curved, as depicted in FIG. 8. However, other configurations, such as straight beams, may also be used.

Decoupling springs may be positioned in relation to a composite frame in an arrangement suitable to accommodate and dissipate stresses resulting from a CTE mismatch between the composite frame and an underlying substrate. Referring to FIG. 9, a MEMS structure 900 is disposed above a substrate 902. MEMS structure 900 includes a resonator member 904 housed in a composite frame 906. In an embodiment, composite frame 906 has a ring shape, as depicted in FIG. 9. For convenience, drive and sense electrodes are not depicted. Composite frame 906 is composed of a first material 914 and a second material 916 having differing CTEs and second material 916 is contained within a pair of trenches. In accordance with an embodiment of the present invention, four decoupling springs 920, each including a suspended beam 930, are coupled to composite frame 906 and anchored to substrate 902 by anchors 925. In an embodiment, decoupling springs 920 are arranged to be at approximately 45 degree angles to the longest and shortest axes of resonator member 904. In one embodiment, such an arrangement allows for dissipation of CTE mismatch stress with negligible impact to resonator member 904. It is to be understood, however, that other arrangements for decoupling springs 920, including varying the number of decoupling springs used, may be contemplated according to the desired characteristics of MEMS structure 900 and, in particular, of resonator member 904.

Figure 10A:
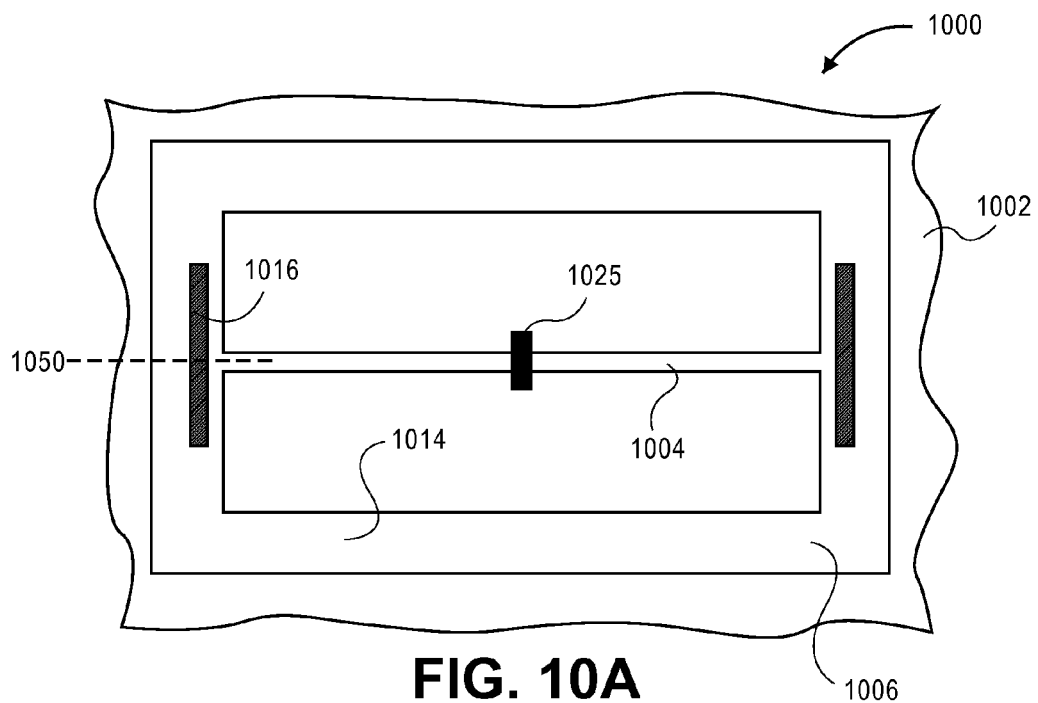
FIG. 10A illustrates a plan view representing a MEMS structure having a rectangle-shaped composite frame and a single anchor point along a resonator member housed in the frame, in accordance with an embodiment of the present invention.
Figure 10B:
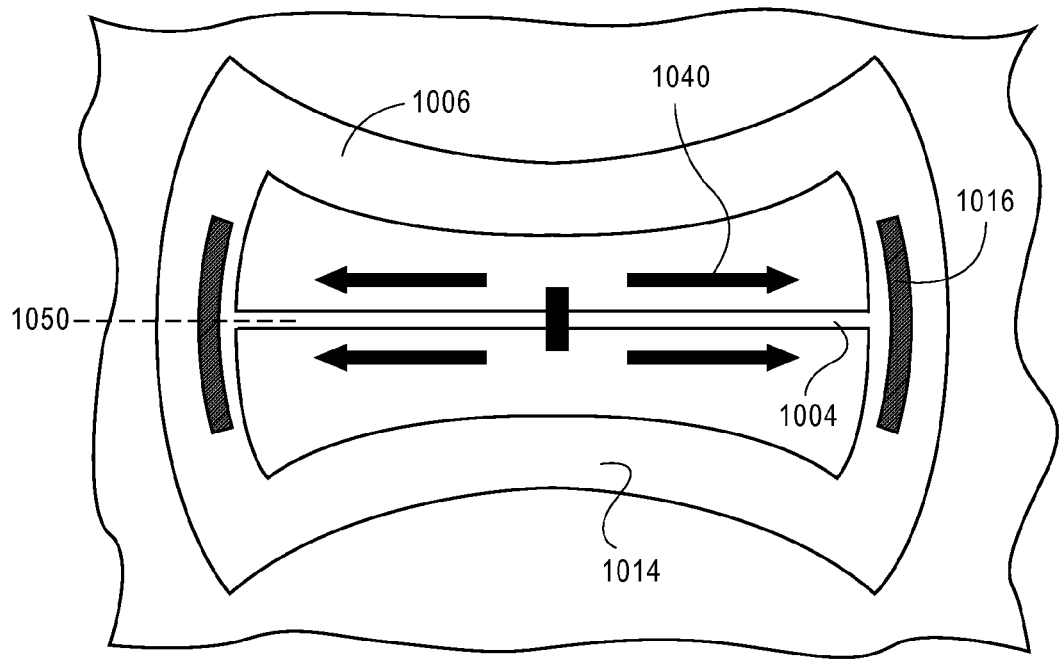
FIG. 10B illustrates a plan view representing the MEMS structure of FIG. 10A responding to a change in temperature, in accordance with an embodiment of the present invention.
Figure 10C:
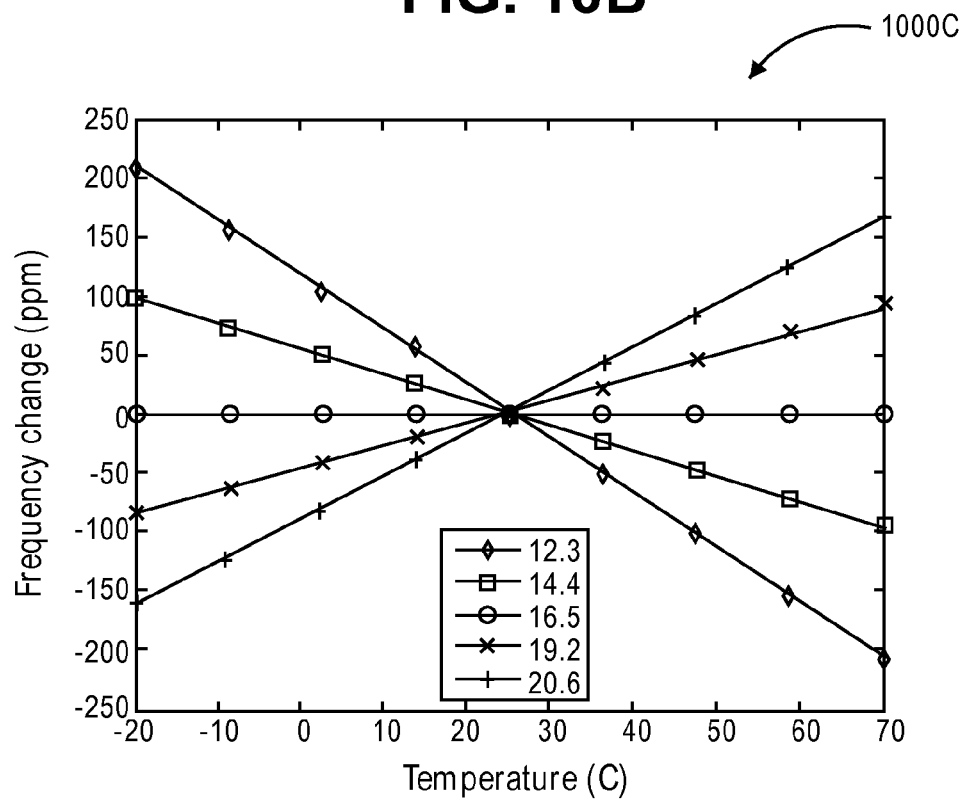
FIG. 10C illustrates a correlation plot of frequency variation as a function of temperature for a series of MEMS structures, each having a rectangle-shaped composite frame and a single anchor point along a resonator member housed in the frame, in accordance with an embodiment of the present invention.

In another aspect of the present invention, a MEMS stress inducer member is decoupled from an underlying substrate by completely suspending a composite frame above the underlying substrate and by anchoring the MEMS structure by a single anchor coupled to the substrate and to a resonator member housed in the stress inducer member. For example, FIG. 10A illustrates a plan view representing a MEMS structure having a rectangle-shaped composite frame and a single anchor point along a resonator member housed in the frame, in accordance with an embodiment of the present invention. FIG. 10B illustrates a plan view representing the MEMS structure of FIG. 10A responding to a change in temperature, in accordance with an embodiment of the present invention. FIG. 10C illustrates a correlation plot of frequency variation as a function of temperature for a series of MEMS structures, each having a rectangle-shaped composite frame and a single anchor point along a resonator member housed in the frame, in accordance with an embodiment of the present invention.

Referring to FIG. 10A, a MEMS structure 1000 is disposed above a substrate 1002. MEMS structure 1000 includes a resonator member 1004 housed in a composite frame 1006 along an axis 1050. In an embodiment, frame 1006 has a rectangle shape, as depicted in FIG. 10. In accordance with an embodiment of the present invention, a single anchor 1025 couples resonator member 1004 to substrate 1002. In one embodiment, resonator member 1004 has a mid-point and anchor 1025 is located approximately at the mid-point, as depicted in FIG. 10A. Accordingly, composite frame 1006 is completely suspended above substrate 1002. In an embodiment, composite frame 1006 is composed of a first material 1014 and a second material 1016 having differing CTEs. In one embodiment, the CTE of second material 1016 is less than the CTE of first material 1014 and resonator member 1004 has a negative TCf such that the resonance frequency of resonator member 1004 would otherwise decrease with increasing temperature.

Referring to FIG. 10B, composite frame 1006 responds to a changing temperature by deforming in shape. In one embodiment, the shape and positioning of a region of composite frame 1006 is altered in response to an increase in temperature. For example, in a specific embodiment, second material 1016 has a CTE less than the CTE of first material 1014 and therefore expands less in response to an increase in temperature than does first material 1014. Accordingly, the regions of frame 1006 composed of second material 1016 expand less than those regions composed of first material 1014 and, thus, frame 1006 deforms from its original rectangle shape. As a consequence of second material 1016 being incorporated proximate to the inner edge of frame 1006 and parallel with axis 1050 of resonator member 1004, the deformation resulting from the CTE mismatch results in a tensile stress induced on resonator member 1004 in response to an increase in temperature, as depicted by the arrows 1040. In an embodiment, the tensile stress induced on resonator member 1004 counters a negative TCf otherwise characteristic of resonator member 1004. In one embodiment, the tensile stress induced on resonator member 1004 approximately cancels the effects of a negative TCf otherwise characteristic of resonator member 1004, maintaining approximately the same resonance frequency for resonator member 1004 across a range of temperatures. Thus, in accordance with an embodiment of the present invention, resonator member 1004 is a temperature-compensated resonator member.

Referring to FIG. 10C, the temperature response of frequency is provided for a resonator member anchored by a single anchor to a substrate, and housed in a rectangle-shaped frame having trenches containing a second material with a CTE less than the CTE of the rest of the material of the frame, as a function of the distribution of the second material within the frame. In this example, the beam length of the resonator member is fixed at approximately 34.3 microns and the beam width is fixed at approximately 1.8 microns. For these dimensions, the anti-symmetric mode (the $11^{th}$ mode) of the resonator member has a frequency of approximately 330 kHz. The rectangle-shaped frame has a width of approximately 50.3 microns and a length of approximately 86.6 microns. Correlation plot 1000C plots correlations for several lengths, in microns, of the trenches of the second material within the rectangle-shaped frame. The pair of trenches is positioned approximately parallel with longest axis of the resonator member. By varying the length of each of the trenches, the frequency of the resonator member may be adjusted to a desired value. Under the above conditions, the frequency change of the resonator member over the temperature range of −20-70 degrees Celsius can approximately be negated at a trench length of approximately 16.5 microns. That is, in accordance with an embodiment of the present invention, a TCf of a singly anchored resonator member is effectively zeroed-out by inducing a stress from a suspended stress-inducer member on the resonator member in response to a changing temperature.

Figure 11:
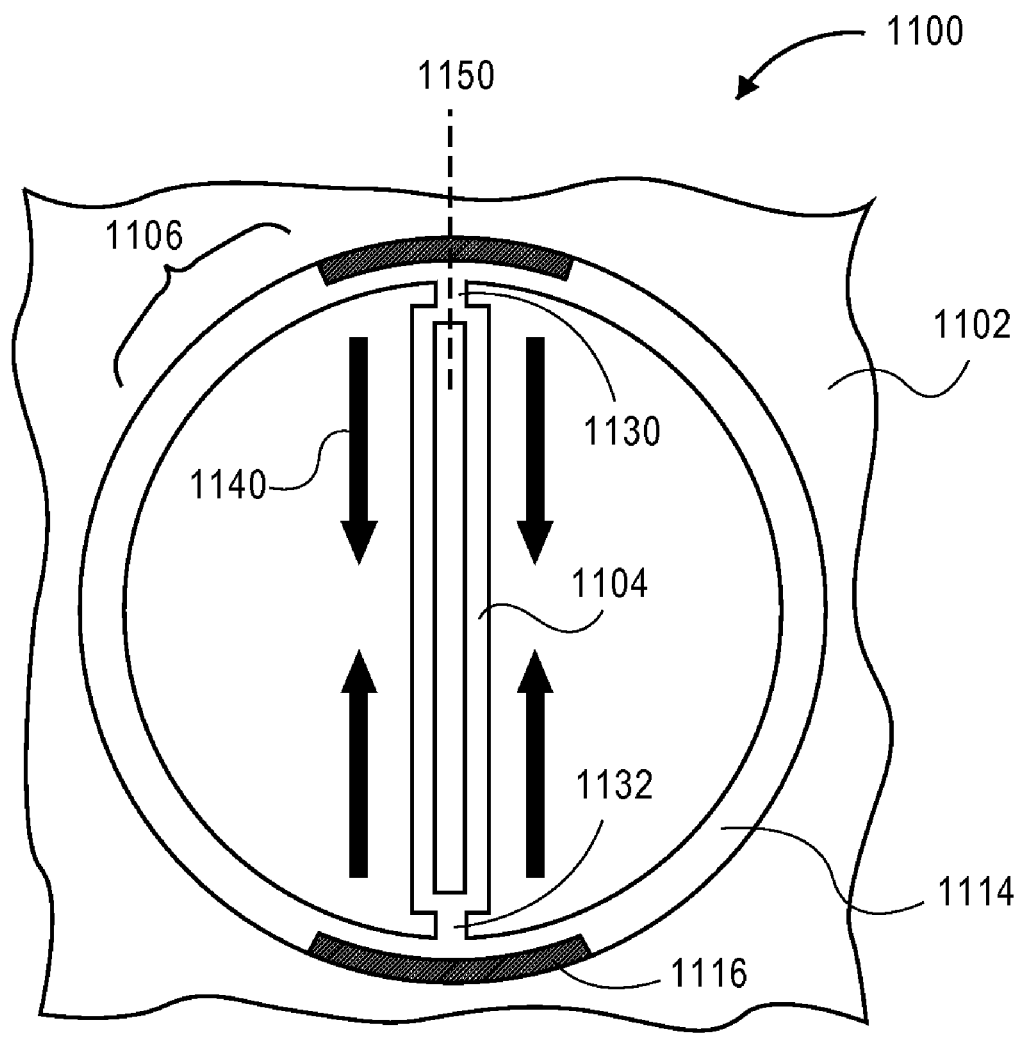
FIG. 11 illustrates a plan view representing a MEMS structure having a composite frame with filled trenches parallel with the axis of a resonator member housed in the composite frame, and proximate to the outer edges of the composite frame, in accordance with an embodiment of the present invention.

A stress inducer member may also be used to compensate for a positive TCf of a resonator member in a MEMS structure. FIG. 11 illustrates a plan view representing a MEMS structure having a composite frame with filled trenches parallel with the axis of a resonator member housed in the composite frame, and proximate to the outer edges of the composite frame, in accordance with an embodiment of the present invention.

Referring to FIG. 11, a MEMS structure 1100 is disposed above a substrate 1102. MEMS structure 1100 includes a resonator member 1104 housed in a frame 1106. In an embodiment, frame 1106 has a ring shape, as depicted in FIG. 11. For convenience, drive and sense electrodes are not depicted. Also, FIG. 11 does not depict the means by which frame 1106 is coupled with substrate 1102. Frame 1106 may be coupled with substrate 1102 by an approach such as the approaches described herein with respect to other embodiments of the present invention. In accordance with an embodiment of the present invention, frame 1106 is a composite frame composed of a first material 1114 and a second material 1116 having differing CTEs, and second material 1116 is contained within a pair of trenches, as depicted in FIG. 11. In one embodiment, the CTE of second material 1116 is less than the CTE of first material 1114. In accordance with an embodiment of the present invention, resonator member 1104 has a positive TCf such that the resonance frequency of resonator member 1104 would otherwise decrease with increasing temperature.

Resonator member 1104 of FIG. 11 is depicted as being coupled to frame 1106 at a first point 1130 and a second point 1132, forming an axis 1150. In one embodiment, a pair of trenches containing second material 1116 is positioned approximately parallel to the axis, as depicted in FIG. 11. In a specific embodiment, the pair of trenches is proximate to the outer surface of frame 1106 and distant from the inner surface of frame 1106. In a particular embodiment, frame 1106 completely surrounds resonator member 1104 in a plane of resonator member 1104 and the pair of trenches is in that same plane, as is also depicted in FIG. 11. In accordance with an embodiment of the present invention, frame 1106 responds to a changing temperature by deforming in shape, outward along axis 1150 perpendicular to axis 1150, approximately orthogonal to the deformation described in association with FIG. 3B. For example, in one embodiment, second material 1116 has a CTE less than the CTE of first material 1114 and therefore expands less in response to an increase in temperature than does first material 1114. Accordingly, the regions of frame 1106 that are composed of second material 1116 expand less than those regions composed of first material 1114 and, thus, frame 1106 deforms from its original ring shape. As a consequence of second material 1116 being incorporated proximate to the outer edge of frame 1106 and parallel with axis 1150 of resonator member 1104, the deformation resulting from the CTE mismatch between first material 1114 and second material 1116 results in a compressive stress induced on resonator member 1104 in response to an increase in temperature, as depicted by the arrows 1140. Thus, when the CTE of second material 1116 is less than the CTE of first material 1114, the depicted arrangement allows frame 1106 to act as a compressive stress inducer for resonator member 1104 in response to an increasing temperature. In an embodiment, the compressive stress induced on resonator member 1104 counters a positive TCf otherwise characteristic of resonator member 1104. In one embodiment, the compressive stress induced on resonator member 1104 approximately cancels the effects of a positive TCf otherwise characteristic of resonator member 1104, maintaining approximately the same resonance frequency for resonator member 1104 across a range of temperatures. Thus, in accordance with an embodiment of the present invention, resonator member 1104 is a temperature-compensated resonator member.

It is to be understood that, in accordance with an embodiment of the present invention, other arrangements may be used to compensate for a positive TCf of resonator member 1104. For example, instead of positioning the trenches of second material 1116 to be proximate to the outer edge of frame 1106, as described in association with FIG. 11, a CTE mismatch switch may instead be incorporated into frame 1106. In one embodiment, the CTE of second material 1116 is selected to be greater than the CTE of first material 1114 and the plurality of trenches containing second material 1116 is positioned along axis 1150 proximate to the inner edge of frame 1106. Thus, in addition to positioning selections, a CTE mismatch pairing may be selected to best modify or negate the TCf of a resonator member.

A MEMS structure having a resonator member housed in a composite frame may be fabricated by a technique suitable to pair materials having different CTEs into a single MEMS structure. In one embodiment, all process steps used to form the MEMS structure are carried out at a temperature less than approximately 450° C. for optimal integration of the MEMS structure with a pre-fabricated CMOS circuit. In a specific embodiment, a damascene process is used to fabricate a MEMS structure having a stress-inducer temperature-compensated resonator member. FIGS. 12A-12D illustrate isometric views representing process operations in the fabrication of a MEMS structure having a composite frame, in accordance with an embodiment of the present invention.

Figure 12A:
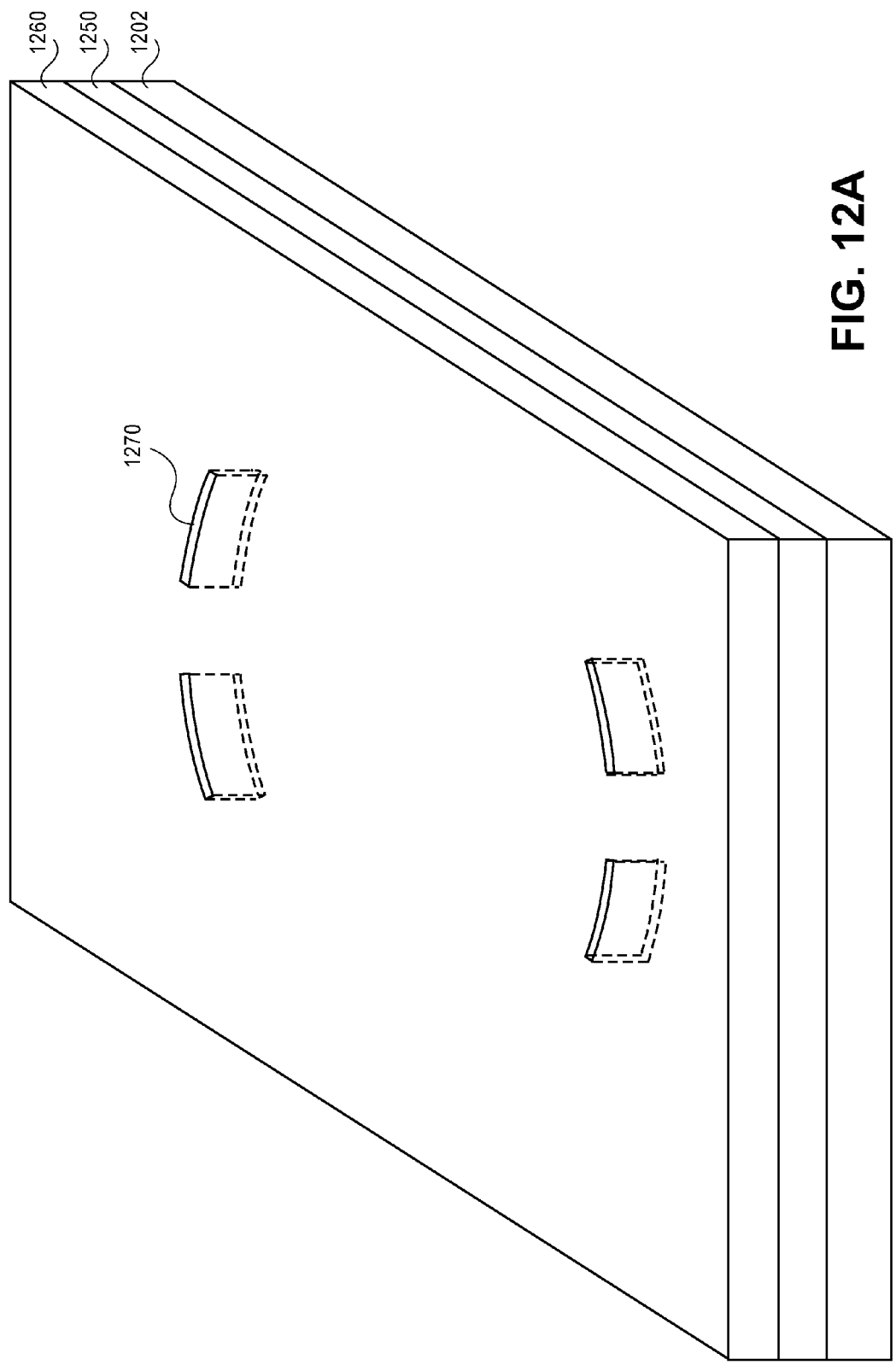
FIGS. 12A-12D illustrate isometric views representing process operations in the fabrication of a MEMS structure having a composite frame, in accordance with an embodiment of the present invention.

Referring to FIG. 12A, a stacked structure is provided including a substrate 1202 having a release layer 1250 and a first structural layer 1260. Substrate 1202 and first structural layer 1260 may be composed of materials described in association with substrate 202 and first material 214, respectively, described in association with FIG. 2. In accordance with an embodiment of the present invention, a plurality of trenches 1270 is formed in first structural layer 1260.

First structural layer 1260 may be deposited by a technique suitable to generate a uniform material layer of consistent composition. In accordance with an embodiment of the present invention, first structural layer 1260 is deposited by a process such as, but not limited to, chemical vapor deposition, physical vapor deposition, atomic layer deposition, electroplating or electro-less plating deposition. In a specific embodiment, first structural layer 1260 is deposited by a low-pressure CVD process that utilizes the precursor gases $SiH_4$ and $GeH_4$ at a combined pressure approximately in the range of 200-1000 mTorr. In one embodiment, first structural layer 1260 is formed by first blanket depositing a material layer above release layer 1250 and subsequently planarizing the material layer. First structural layer 1260 may be composed of a material that is formed by a low temperature process. Thus, in accordance with another embodiment of the present invention, first structural layer 1260 is composed of a material formed at a temperature less than approximately 450° C.

Release layer 1250 may be composed of a material suitable to withstand a MEMS fabrication process and suitable for removal selective to first structural layer 1260. For example, in accordance with an embodiment of the present invention, release layer 1250 is composed of a material such as, but not limited to, an insulator or a semiconductor. In one embodiment, release layer 1250 is an insulator material and is composed of a material such as, but not limited to, silicon dioxide, silicon nitride, silicon oxy-nitride or a high-K dielectric material. In one embodiment, release layer 1250 is a semiconductor material such as, but not limited to, silicon, germanium, silicon-germanium, carbon-doped silicon, carbon-doped silicon-germanium or a III-V material. The semiconductor material may also be composed of dopant impurity atoms. For example, in one embodiment, the semiconductor material is composed of germanium atoms and the concentration of dopant impurity atoms is selected to optimize the germanium nucleation at a temperature approximately in the range of 300-400° C. In a specific embodiment, release layer 1250 is composed of greater than approximately 98% germanium atoms along with boron dopant impurity atoms having a total atomic concentration approximately in the range of $5 \times 10^{19}$-$5 \times 10^{20}$ atoms/cm$^3$. Release layer 1250 may be composed of a material that can be removed with high selectivity to first structural layer 1260. For example, in accordance with an embodiment of the present invention, first structural layer 1260 is composed of silicon-germanium and release layer 1250 is composed of germanium. In a specific embodiment, both the silicon-germanium structural layer and the germanium release layer are doped with boron dopant impurity atoms. In another embodiment, first structural layer 1260 is composed of silicon-germanium and release layer 1250 is composed of silicon.

Release layer 1250 may be formed on substrate 1202 by a suitable deposition process that generates a uniform material layer of consistent composition and is conformal to any patterning already present on the surface of substrate 1202. For example, in accordance with an embodiment of the present invention, release layer 1250 is deposited by a process such as, but not limited to, chemical vapor deposition, physical vapor deposition or atomic layer deposition. Release layer 1250 may be deposited by a low temperature deposition process. In a specific embodiment, substrate 1202 is composed of an insulator layer above an integrated circuit and release layer 1250 is deposited by a low-pressure chemical vapor deposition process at a temperatures less than approximately 450° C. The thickness of release layer 1250 may be a thickness suitable to provide a suspension height necessary for a desired MEMS application. For example, in accordance with an embodiment of the present invention, the thickness of release layer 1250 determines the height at which a MEMS resonator member is subsequently suspended above substrate 1202. In one embodiment, the thickness of release layer 1250 is approximately in the range of 0.1-5 microns.

Referring again to FIG. 12A, trenches 1270 are formed in first structural layer 1260. In accordance with an embodiment of the present invention, release layer 1250 acts as an etch stop during the patterning of first structural layer 1260 to form trenches 1270. First structural layer 1260 may be patterned by a lithographic and etch process suitable to provide an appropriately sized trench 1270 and suitable to not etch a significant portion of release layer 1250. For example, in accordance with an embodiment of the present invention, first structural layer 1260 is patterned by first patterning a positive photo-resist layer above first structural layer 1260 via exposure to a wavelength of light such as, but not limited to, 248 nm, 193 nm or 157 nm. In another embodiment, an e-beam direct-write process is used to pattern the positive photo-resist layer. An etch process may then be used to pattern first structural layer 1260 with selectivity to release layer 1250. In one embodiment, a dry etch process is used to etch first structural layer 1260 with a selectivity to release layer 1250 of at least approximately 10:1. In a particular embodiment, first structural layer 1260 is composed of silicon-germanium, release layer 1250 is composed of germanium, and the dry etch process includes an anisotropic plasma etch process wherein the plasma is generated from gases such as, but not limited to, $SF_6$ or the combination of HBr, $Cl_2$ and $O_2$. In one embodiment, although not depicted, a hard-mask layer is utilized in between the positive photo-resist layer and first structural layer 1260.

Figure 12B:
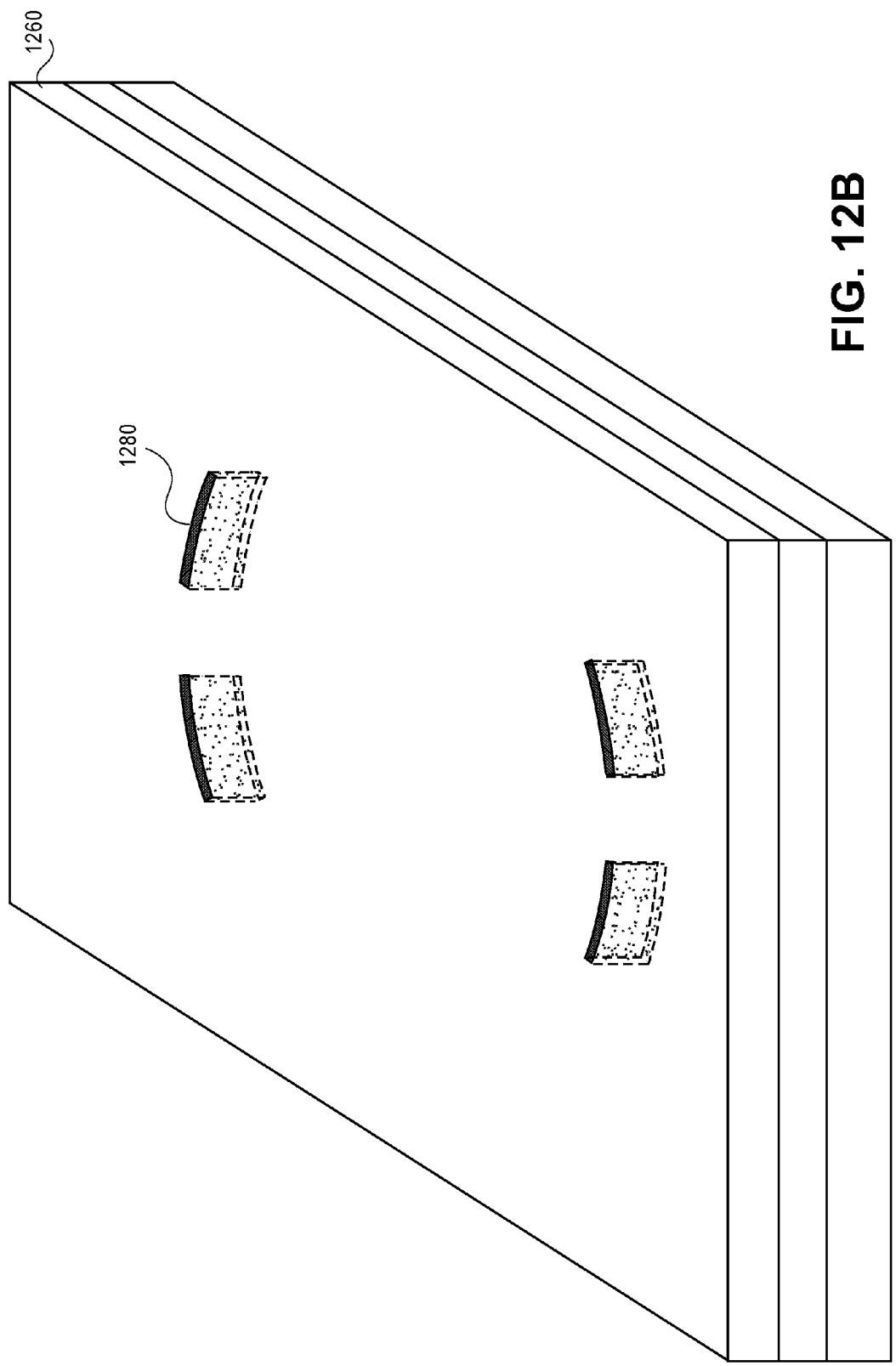

Referring to FIG. 12B, trenches 1270 are filled with a second structural layer 1280. Second structural layer 1280 may be formed from a material suitable to withstand a MEMS fabrication process, to substantially fill trenches 1270, and to satisfy the required characteristics of a composite frame. For example, in accordance with an embodiment of the present invention, second structural layer 1280 is composed of silicon dioxide. Any portion of second structural layer 1280 not in trenches 1270 may be removed prior to further processing. Removal of such portions of second structural layer 1280 may be performed by using a suitable removal technique that has high selectivity to first structural layer 1260. For example, in accordance with an embodiment of the present invention, the portion of second structural layer 1280 not in trenches 1270 is removed by a dry etch process wherein first structural layer 1260 is used as an etch stop layer. In one embodiment, second structural layer 1280 is an insulator layer and etch gases such as, but not limited to, $CF_4$ or the combination $Cl_2$, HBr, $O_2$ and $BCl_3$ are used to generate a plasma for the dry etch process. In accordance with another embodiment of the present invention, second structural layer 1280 is planarized with a chemical-mechanical process step with an end-point determined by exposure of the top surface of first structural layer 1260. In one embodiment, the portion of second structural layer 1280 not in trenches 1270 is removed by polishing with a slurry composed of species such as, but not limited to, the combination of silica beads, ammonium hydroxide and water.

Figure 12C:
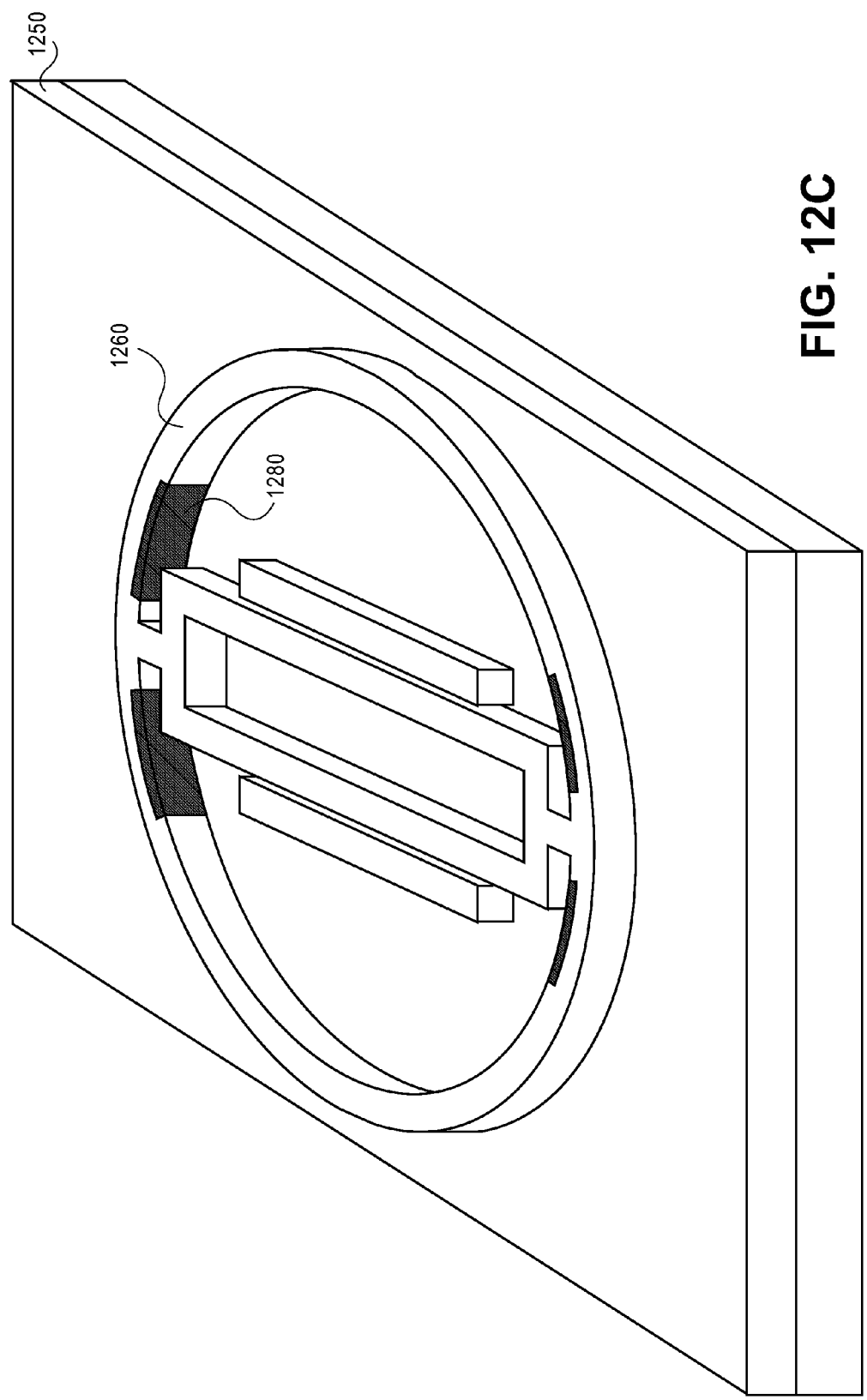

Referring to FIG. 12C, first structural layer 1260 is patterned to expose the top surface of release layer 1250. Thus, features for a MEMS structure including regions of first structural layer 1260 directly adjacent second structural layer 1280 are provided. First structural layer 1260 may be patterned by a suitable patterning process that provides the required dimensions of a MEMS structure. In one embodiment, first structural layer 1260 is patterned by a lithographic and etch process described in association with the patterning of trenches 1270 from FIG. 12A.

Figure 12D:
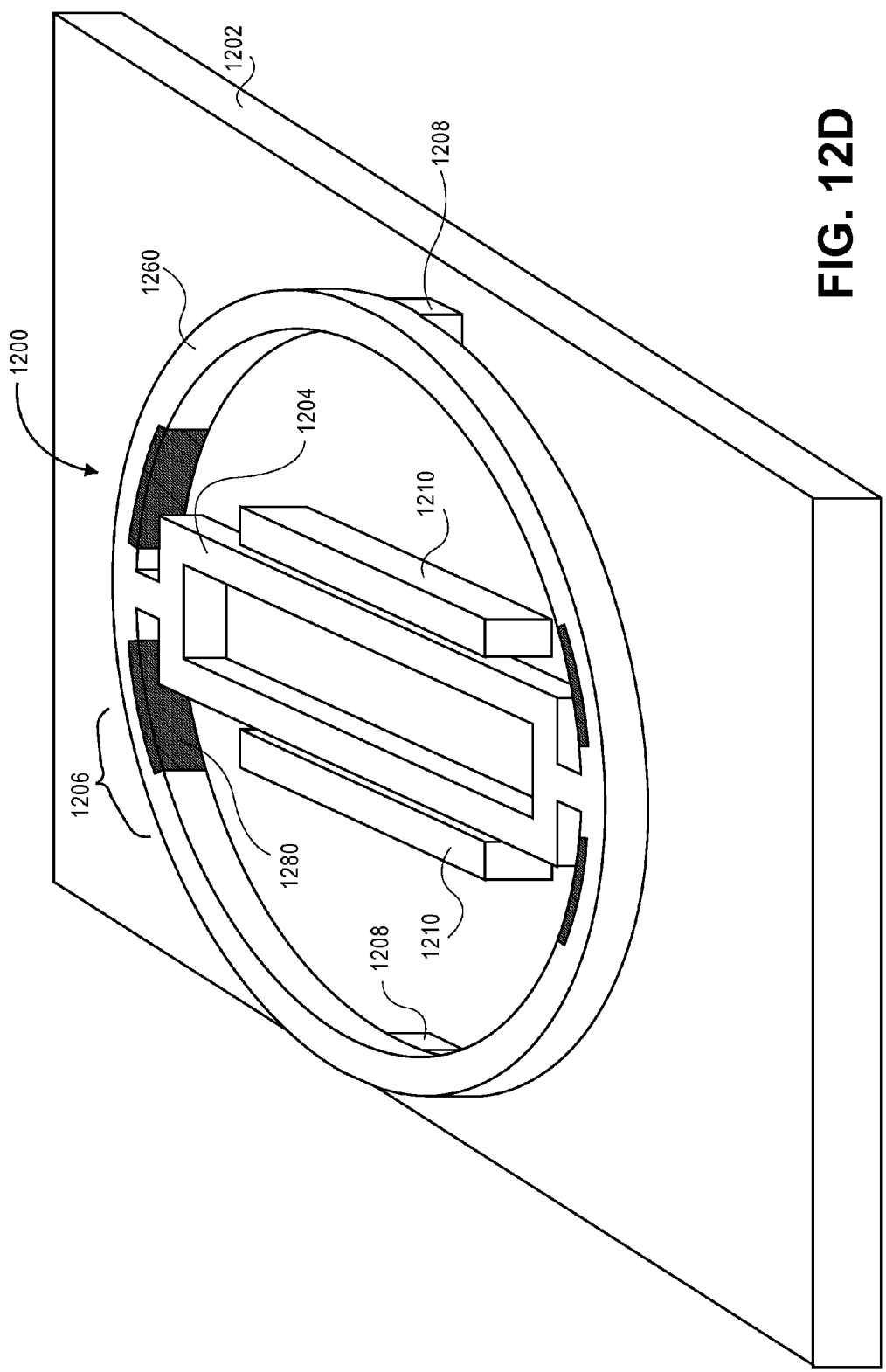

Referring to FIG. 12D, release layer 1250 is removed to provide a MEMS structure 1200 having a resonator member 1204 housed in a composite frame 1206. Release layer 1250 may be removed by any technique that enables removal without significantly impacting first and second structural materials 1260 and 1280. For example, in accordance with an embodiment of the present invention, first structural layer 1260 is composed of silicon-germanium, second structural layer 1280 is composed of silicon dioxide, and release layer 1250 is composed of germanium and is removed by an oxidizing etchant. In a specific embodiment, release layer 1250 is removed with a wet etchant composed of an aqueous solution of $H_2O_2$ with a concentration approximately in the range of 25-35% by volume and a temperature approximately in the range of 80-95° C. In accordance with another embodiment of the present invention, release layer 1250 is composed of silicon and is removed by a high pH etchant. In a specific embodiment, release layer 1250 is removed with a wet etchant composed of an aqueous solution of $NH_4OH$ with a concentration approximately in the range of 1-20% by volume and a temperature approximately in the range of 15-40° C.

Anchors 1208 that couple composite frame 1206 with substrate 1202 are also exposed upon the removal of release layer 1250, as depicted in FIG. 12D. Anchors 1208 may be fabricated by a suitable technique that substantially aligns them with composite frame 1206. For example, in accordance with an embodiment of the present invention, prior to the deposition of first structural layer 1260, release layer 1250 is first patterned with trenches that expose a portion of substrate 1202, i.e. prior to the process steps described in association with FIGS. 12A-12D, thus enabling formation of anchors 1208 by way of a preliminary damascene process. Also, extended electrodes 1210 coupled to substrate 1202 may be fabricated by a similar approach.

Thus, a MEMS structure having a stress-inducer temperature-compensated resonator member has been disclosed. In an embodiment, the MEMS structure includes a frame disposed above a substrate. The frame has an inner surface and an outer surface and is composed of a first material having a first CTE and a second material having a second CTE, different from the first CTE. A resonator member is coupled to the inner surface of the frame. In one embodiment, the MEMS structure further includes one or more anchors, each anchor coupled to the frame and to the substrate. The resonator member is suspended above the substrate. In another embodiment, the MEMS structure further includes one or more decoupling springs coupled to the frame and anchored to the substrate. Again, the resonator member is suspended above the substrate. In yet another embodiment, the MEMS structure further includes an anchor coupled to the resonator member and to the substrate, wherein the resonator member has a mid-point and the anchor is located approximately at the mid-point. In that embodiment, the frame is suspended above the substrate.

What is claimed is:

1. A MEMS structure, comprising:
a frame having a shape and being disposed above a substrate, wherein said frame has an inner surface and an outer surface and comprises one or more regions of first material having a first coefficient of thermal expansion (CTE) and one or more regions of second material having a second CTE, different from said first CTE; and
a resonator member coupled to said inner surface of said frame;
where the regions of first material having the first CTE respond differently to a change in temperature than the regions of second material having the second CTE to cause the shape of the frame to deform, the deformation in shape of the frame resulting from the difference in CTE of the first material and the CTE of the second material and resulting in stress induced on the resonator member in response to the temperature change.

2. A MEMS structure, comprising:
a frame disposed above a substrate, wherein said frame has an inner surface and an outer surface and comprises a first material having a first coefficient of thermal expansion (CTE) and a second material having a second CTE, different from said first CTE; and
a resonator member coupled to said inner surface of said frame;
wherein said second material is contained within a plurality of trenches disposed in said first material of said frame.

3. The MEMS structure of claim 2, wherein said resonator member is coupled to said frame at a first point and a second point, forming an axis, and wherein said plurality of trenches is positioned approximately parallel with said axis.

4. The MEMS structure of claim 3, wherein said plurality of trenches is proximate to said inner surface of said frame and distant from said outer surface of said frame.

5. The MEMS structure of claim 2, wherein said resonator member is coupled to said frame at a first point and a second point, forming an axis, and wherein said plurality of trenches is positioned approximately perpendicular to said axis.

6. The MEMS structure of claim 5, wherein said plurality of trenches is distant from said inner surface of said frame and proximate to said outer surface of said frame.

7. The MEMS structure of claim 6, wherein said second material is contained within a second plurality of trenches disposed in said first material of said frame, wherein said second plurality of trenches is positioned approximately parallel with said axis, and wherein said second plurality of trenches is proximate to said inner surface of said frame and distant from said outer surface of said frame.

8. The MEMS structure of claim 1, wherein said frame has a shape selected from the group consisting of a ring shape, a square shape, an oval shape, and a rectangle shape.

9. The MEMS structure of claim 2, wherein said second CTE is less than said first CTE.

10. The MEMS structure of claim 9, wherein said first material is a semiconductor and said second material is a dielectric.

11. The MEMS structure of claim 10, wherein said semiconductor comprises at least one of silicon and germanium and said dielectric comprises silicon dioxide.

12. A MEMS structure, comprising:
a frame disposed above a substrate, wherein said frame has an inner surface and an outer surface and comprises a first material having a first coefficient of thermal expansion (CTE) and a second material having a second CTE, different from said first CTE;
a resonator member coupled to said inner surface of said frame; and
one or more anchors, each anchor coupled to said frame and to said substrate, wherein said resonator member is suspended above said substrate.

13. A MEMS structure, comprising:
a frame disposed above a substrate, wherein said frame has an inner surface and an outer surface and comprises a first material having a first coefficient of thermal expansion (CTE) and a second material having a second CTE, different from said first CTE;
a resonator member coupled to said inner surface of said frame; and
one or more decoupling springs coupled to said frame and anchored to said substrate, wherein said resonator member is suspended above said substrate.

14. A MEMS structure, comprising:
a frame disposed above a substrate, wherein said frame has an inner surface and an outer surface and comprises a first material having a first coefficient of thermal expansion (CTE) and a second material having a second CTE, different from said first CTE;
a resonator member coupled to said inner surface of said frame; and
an anchor coupled to said resonator member and to said substrate, wherein said resonator member has a mid-point and said anchor is located approximately at said mid-point, and wherein said frame is suspended above said substrate.

15. The MEMS structure of claim 1, wherein said second material is exposed at said inner surface or said outer surface, or both, of said frame.

16. A MEMS structure, comprising:
a frame disposed above a substrate, wherein said frame has an inner surface and an outer surface and comprises a first material having a first coefficient of thermal expansion CTE and a second material having a second CTE different from said first CTE; and
a resonator member coupled to said inner surface of said frame;
wherein said second material is not exposed at said inner surface of said frame and is not exposed at said outer surface of said frame.

17. The MEMS structure of claim 3, wherein said plurality of trenches is distant from said inner surface of said frame and proximate to said outer surface of said frame.

18. The MEMS structure of claim 1, wherein the frame comprises a stress inducer member; and wherein said resonator member is, in one plane, completely surrounded by said stress inducer member.

19. The MEMS structure of claim 18, wherein said stress inducer member comprises a first material having a first coefficient of thermal expansion (CTE) and a second material having a second CTE, less than said first CTE, and wherein said resonator member comprises said first material.

20. The MEMS structure of claim 19, wherein said second material is contained within a plurality of trenches disposed in said first material of said stress inducer member.

21. The MEMS structure of claim 20, wherein said resonator member is coupled to and inner surface of said stress inducer member at a first point and a second point, forming an axis, and wherein said plurality of trenches is positioned approximately parallel with said axis.

22. The MEMS structure of claim 21, wherein said plurality of trenches is, in the same plane as said resonator member, proximate to said inner surface of said stress inducer member and distant from an outer surface of said stress inducer member.

23. The MEMS structure of claim 20, wherein said resonator member is coupled to an inner surface of said stress inducer member at a first point and a second point, forming an axis, and wherein said plurality of trenches is positioned approximately perpendicular to said axis.

24. The MEMS structure of claim 23, wherein said plurality of trenches is, in the same plane as said resonator member, distant from said inner surface of said stress inducer member and proximate to an outer surface of said stress inducer member.

25. The MEMS structure of claim 19, wherein said first material is a semiconductor and said second material is a dielectric.

26. The MEMS structure of claim 25, wherein said semiconductor comprises at least one of silicon and germanium and said dielectric comprises silicon dioxide.

27. The MEMS structure of claim 20, wherein at least one of said plurality of trenches is exposed at a surface of said stress inducer member, in the same plane as said resonator member.

28. The MEMS structure of claim 20, wherein none of said plurality of trenches is exposed at a surface of said stress inducer member, in the same plane as said resonator member.

29. The MEMS structure of claim 18, further comprising:
one or more anchors, each anchor coupled to said stress inducer member and to said substrate, wherein said resonator member is suspended above said substrate.

30. The MEMS structure of claim 18, further comprising:
one or more decoupling springs coupled to said stress inducer member and anchored to said substrate, wherein said resonator member is suspended above said substrate.

31. The MEMS structure of claim 18, further comprising:
an anchor coupled to said resonator member and to said substrate, wherein said resonator member has a mid-point and said anchor is located approximately at said mid-point, and wherein said stress inducer member is suspended above said substrate.

32. A method for altering the thermal coefficient of frequency of a MEMS structure, comprising:

providing a resonator member housed in a stress inducer member disposed above a substrate, wherein said stress inducer member has a shape and comprises one or more regions of first material having a first coefficient of thermal expansion (CTE) and one or more regions of second material having a second CTE, different from said first CTE, and wherein said resonator member comprises said first material; and inducing a stress on said resonator member with said stress inducer member in response to a change in temperature by deforming the shape of the stress inducer, where the regions of first material having the first CTE respond differently to the change in temperature than the regions of second material having the second CTE to cause the shape of the stress inducer member to deform, the deformation in shape of the stress inducer member resulting from the difference in CTE of the first material and the CTE of the second material and resulting in the stress induced on the resonator member in response to the temperature change.

33. The method of claim 32, wherein inducing said stress comprises inducing a tensile stress on said resonator member in response to an increase in temperature.

34. The method of claim 32, wherein inducing said stress comprises inducing a compressive stress on said resonator member in response to a decrease in temperature.

35. The method of claim 32, wherein inducing said stress comprises inducing a compressive stress on said resonator member in response to an increase in temperature.

36. The method of claim 32, wherein inducing said stress comprises inducing a tensile stress on said resonator member in response to a decrease in temperature.

37. The MEMS structure of claim 1, where the regions of first material having the first CTE expand less in response to an increase in temperature than do the regions of second material having the second CTE to cause the shape of the frame to deform, the deformation in shape of the frame resulting in stress induced on the resonator member in response to the temperature increase.

* * * * *